United States Patent
Nakano

(10) Patent No.: US 8,294,873 B2
(45) Date of Patent: Oct. 23, 2012

(54) EXPOSURE METHOD, DEVICE MANUFACTURING METHOD, AND SUBSTRATE

(75) Inventor: Katsushi Nakano, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1332 days.

(21) Appl. No.: 11/667,446

(22) PCT Filed: Nov. 11, 2005

(86) PCT No.: PCT/JP2005/020728
§ 371 (c)(1), (2), (4) Date: May 10, 2007

(87) PCT Pub. No.: WO2006/051909
PCT Pub. Date: May 18, 2006

(65) Prior Publication Data
US 2008/0107999 A1    May 8, 2008

(30) Foreign Application Priority Data

Nov. 11, 2004 (JP) ............................. P2004-327790
Feb. 25, 2005 (JP) ............................. P2005-050887
Jul. 8, 2005 (JP) ............................. P2005-200637

(51) Int. Cl.
*G03B 27/52* (2006.01)
(52) U.S. Cl. ........................................... 355/30
(58) Field of Classification Search .................. 355/30, 355/53; 430/495.1, 270.1, 311, 913, 914, 430/919
See application file for complete search history.

(56) References Cited

U.S. PATENT DOCUMENTS

| | | | |
|---|---|---|---|
| 4,346,164 | A | 8/1982 | Tabarelli et al. |
| 4,480,910 | A | 11/1984 | Takanashi et al. |
| 5,194,893 | A | 3/1993 | Nishi |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 5,969,441 | A | 10/1999 | Loopstra et al. |

(Continued)

FOREIGN PATENT DOCUMENTS

DE    221 563 A1    4/1985

(Continued)

OTHER PUBLICATIONS

Conley et al. "Understanding the Photoresist Surface-Liquid interface for ArF Immersion lithography" presented 2004 Sematech Immersion & 157nm Symposium on Aug. 4, 2004.*

(Continued)

*Primary Examiner* — Hung Henry Nguyen
*Assistant Examiner* — Steven H Whitesell Gordon
(74) *Attorney, Agent, or Firm* — Oliff & Berridge, PLC

(57) ABSTRACT

An exposure method for exposing a substrate with exposure light that irradiates the substrate via a liquid, wherein the concentration of an eluted substance in the liquid on the substrate is set so as to satisfy the condition $R_W - R_P \leq 1.0 \times 10^{-3}$ when $R_P$ is the transmittance of the liquid containing an eluted substance eluted from the substrate per 1 mm in the optical path direction of the exposure light, and $R_W$ is the transmittance of the liquid that does not contain the eluted substance per 1 mm in the optical path direction of the exposure light.

23 Claims, 12 Drawing Sheets

U.S. PATENT DOCUMENTS

| | | | |
|---|---|---|---|
| 6,778,257 B2 | 8/2004 | Bleeker et al. | |
| 2004/0165159 A1 | 8/2004 | Lof et al. | |
| 2005/0074704 A1* | 4/2005 | Endo et al. | 430/322 |
| 2005/0122497 A1* | 6/2005 | Lyons et al. | 355/53 |
| 2005/0248856 A1 | 11/2005 | Omura et al. | |
| 2005/0250898 A1 | 11/2005 | Maeda et al. | |

FOREIGN PATENT DOCUMENTS

| | | |
|---|---|---|
| DE | 224 448 A1 | 7/1985 |
| EP | 1 598 704 A2 | 11/2005 |
| EP | 1 605 310 A2 | 12/2005 |
| EP | 1 732 108 A1 | 12/2006 |
| EP | 1 741 730 A1 | 1/2007 |
| JP | A 58-202448 | 11/1983 |
| JP | A 59-019912 | 2/1984 |
| JP | A 62-065326 | 3/1987 |
| JP | A 63-157419 | 6/1988 |
| JP | A 04-277612 | 10/1992 |
| JP | A 4-305915 | 10/1992 |
| JP | A 4-305917 | 10/1992 |
| JP | A 5-062877 | 3/1993 |
| JP | A 06-053120 | 2/1994 |
| JP | A 6-124873 | 5/1994 |
| JP | A 06-188169 | 7/1994 |
| JP | A 7-220990 | 8/1995 |
| JP | A 8-037149 | 2/1996 |
| JP | A 08-166475 | 6/1996 |
| JP | A 8-316125 | 11/1996 |
| JP | A-8-316125 | 11/1996 |
| JP | A 08-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 2000-058436 | 2/2000 |
| JP | A 2000-505958 | 5/2000 |
| JP | A 2001-345245 | 12/2001 |
| JP | A 2005-264131 | 9/2005 |
| JP | A-2005-294520 | 10/2005 |
| JP | A 2005-316352 | 11/2005 |
| JP | A-2005-353763 | 12/2005 |
| JP | A-2006-5335 | 1/2006 |
| JP | A 2006-30603 | 2/2006 |
| WO | WO 99/49504 | 9/1999 |
| WO | WO 01/35168 A1 | 5/2001 |
| WO | WO 2004/019128 A2 | 3/2004 |

OTHER PUBLICATIONS

Robertson et al., Characterization and Meaningful Quantification of Resist Component Leaching into Immersion Fluid, presented Aug. 4, 2004, Immersion & 157 nm Symposium.*

Lesuer, Robert et al., "Using Scanning Electrochemical Microscopy to Probe Chemistry at the Solid-Liquid Interface in Chemically Amplified Immersion Lithography," Proceedings of the SPIE—The International Society for Optical Engineering, SPIE US, May 1, 2004, pp. 115-125, vol. 5376.

Hinsberg, William et al., " Liquid Immersion Lithography—Evaluation of Resist Issues," Proceedings of the SPIE—The International Society for Optical Engineering, SPIE US, May 1, 2004, pp. 115-125, vol. 5376.

Dammel, Ralph et al., "193 nm Immersion Lithography—Taking the Plunge," Journal of Photopolymer Science and Technology, Jan. 1, 2004, pp. 587-602, vol. 17—No. 4.

Supplementary European Search Report, issued in European Application No. EP 05 80 6272, mailed Dec. 15, 2009.

Feb. 28, 2006 International Search Report issued in PCT/JP2005/020728 (with translation).

Apr. 6, 2010 Japanese Office Action issued in Japanese Patent Application No. 2006-544985 (with translation).

Jul. 6, 2010 Japanese Notice of Allowance issued in Japanese Patent Application No. 2006-544985 (with translation).

Feb. 28, 2006 Written Opinion issued in PCT/JP2005/020728 (with translation).

Kimura, Masahide et al.,"Jisedai Roko wa Ekishin ni Kimari," Nikkei Microdevices, No. 226, p. 79, 84 and 86 (Apr. 1, 2004).

* cited by examiner

EXPOSURE METHOD, DEVICE MANUFACTURING METHOD, AND SUBSTRATE

TECHNICAL FIELD

The present invention relates to an exposure method that exposes a substrate via a liquid, a device manufacturing method, and a substrate for liquid immersion exposure.

The present application claims priority on Japanese Patent Application Nos. 2004-327790 filed on Nov. 11, 2004, 2005-50887 filed on Feb. 25, 2005, and 2005-200637 filed on Jul. 8, 2005, and the contents thereof are incorporated herein by reference.

BACKGROUND ART

In a photolithography process, which is one of the manufacturing processes for microdevices such as semiconductor devices and liquid crystal display devices, an exposure apparatus that projection exposes a pattern formed on a mask onto a photosensitive substrate is used. This exposure apparatus has a mask stage that supports a mask and a substrate stage that supports a substrate, and it projection exposes the pattern of the mask onto the substrate via a projection optical system. While sequentially moving the mask stage and the substrate stage. In the manufacture of microdevices, due to higher densities of the devices, miniaturization of the pattern formed on the substrate is in demand. In order to respond to this need, higher resolutions for exposure apparatuses have been in demand. Liquid immersion methods that fill the optical path space of the exposure light between the projection optical system and the substrate with a liquid and perform exposure processing via the liquid, such as that disclosed in Patent Document 1 below, have been proposed as one means for realizing those higher resolutions.

Patent Document 1: PCT International Publication No. 99/49504

DISCLOSURE OF INVENTION

Problems to be Solved by the Invention

When exposure processing is performed based on the liquid immersion method, it is important to maintain the liquid in a desired state. In the case where the liquid is not maintained in a desired state, mere is concern that the exposure light will no longer be able to preferably reach onto the substrate, and there is a possibility that this will lead to deterioration of exposure accuracy.

A purpose of some aspects of the invention is to provide an exposure method that is able to maintain the liquid in a desired state to preferably perform exposure processing, a device manufacturing method that uses that exposure method, and a substrate for liquid immersion exposure.

Means for Solving the Problem

According to a first aspect of the present invention, there is provided an exposure method that irradiates exposure light onto a substrate via a liquid on the substrate to expose the substrate; wherein the concentration of eluted substance in the liquid on the substrate is set so as to satisfy the condition $$R_W - R_P \leq 1.0 \times 10^{-3}$$

when $R_P$ is the transmittance of a liquid containing the eluted substance eluted from the substrate per 1 mm in the optical path direction of the exposure light, and $R_W$ is the transmittance of a liquid that does not contain that eluted substance per 1 mm in the optical path direction of the exposure light.

Through the first aspect of the present invention, by setting the concentration of the eluted substance in the liquid so that the amount of decrease in the transmittance of the liquid attributable to the eluted substance is restricted to $1.0 \times 10^{-3}$ (0.1%) or less, the liquid is maintained in a desired state, and the exposure light is able to preferably reach onto the substrate.

According to a second aspect of the present invention, there is provided an exposure method that fills the optical path space of the exposure light between the projection optical system and a substrate with a liquid and irradiates exposure light onto the substrate via the projection optical system and the liquid to expose the substrate; wherein the concentration of eluted substance in the liquid when the eluted substance has been eluted from the substrate into the liquid is set so as to satisfy the condition $$R_P \geq R_r$$

when $R_P$ is the transmittance of the liquid that has been filled into the optical path space in the optical path direction of the exposure light, and $R_r$ is a target transmittance that has been determined in advance.

Through the second aspect of the present invention, the liquid is maintained in a desired state, and the exposure light is able to preferably reach onto the substrate by setting the concentration of the eluted substance in the liquid so as to satisfy the target transmittance of the liquid.

According to a third aspect of the present invention, there is provided an exposure method that forms a liquid immersion area on a substrate and irradiates exposure light onto the substrate via the liquid that forms the liquid immersion area to expose the substrate; wherein the allowable concentration of eluted substance eluted from the substrate in the liquid on the substrate is set based on the transmittance of the liquid with respect to the exposure light in the optical path of the exposure light.

Through the third aspect of the present invention, by setting the allowable concentration of the eluted substance in the liquid based on the transmittance of the liquid with respect to the exposure light in the optical path of the exposure light, the liquid is maintained in a desired state, and the exposure light is able to preferably reach onto the substrate.

According to a fourth aspect of the present invention, there is provided an exposure method that forms a liquid immersion area on a substrate and irradiates exposure light onto the substrate via the liquid that forms the liquid immersion area and an optical member to expose the substrate; wherein the allowable concentration of eluted substance eluted from the substrate in the liquid on the substrate is set based on the transmittance of the liquid contact surface of the optical member with respect to the exposure light.

Through the fourth aspect of the present invention, by setting the allowable concentration of the eluted substance in the liquid based on the transmittance of the liquid contact surface of the optical member, the liquid is maintained in a desired state, and the exposure light is able to preferably reach onto the substrate.

According to a fifth aspect of the present invention, there is provided a device manufacturing method that uses an exposure method of the above aspect.

Through the fifth aspect of the present invention, it is possible to manufacture a device that has the desired performance.

According to a sixth aspect of the present invention, there is provided a substrate for liquid immersion exposure in which exposure light is irradiated via a liquid, the substrate comprising: a base material, and a photosensitive material, which is coated onto the base material and includes a photo acid generator, wherein the amount of photo acid generator eluted into the liquid by coming into contact with the liquid is 2.2 ng/cm$^2$ or less.

Through the sixth aspect of the present invention, by setting the amount of photo acid generator eluted into the liquid to 2.2 ng/cm$^2$ or less, it is possible to maintain the liquid in a desired state and to cause the exposure light to preferably reach onto the substrate.

According to a seventh aspect of the present invention, there is provided a substrate for liquid immersion exposure in which exposure light is irradiated via a liquid, the substrate comprising: a base material, and a photosensitive material, which is coated onto the base material and includes a photo acid generator, wherein the amount of photo acid generator eluted into the liquid by coming into contact with the liquid is 2.5 ng/cm$^2$ or less.

Through the seventh aspect of the present invention, by setting the amount of photo acid generator eluted into the liquid to 2.5 ng/cm$^2$ or less, it is possible to maintain the liquid in a desired state and to cause the exposure light to preferably reach onto the substrate.

According to a eighth aspect of the present invention, there is provided a substrate for liquid immersion exposure in which exposure light is irradiated via a liquid; wherein it has a base material, and a photosensitive material, which is coated onto the base material and includes an amine group substance, and the amount of amine group substance eluted into the liquid by coming into contact with the liquid is 1.1 ng/cm$^2$ or less.

Through the eighth aspect of the present invention, by setting the amount of amine group substance eluted into the liquid to 1.1 ng/cm$^2$ or less, it is possible to maintain the liquid in a desired state and to cause the exposure light to preferably reach onto the substrate.

Effects of the Invention

Through the present invention, it is possible to maintain the liquid in a desired state to preferably perform exposure processing.

BEST MODE FOR CARRYING OUT THE INVENTION

Embodiments of the present invention will be explained below while referring to drawings, but the present invention is not limited to these.

Exposure Apparatus

Figure 1:
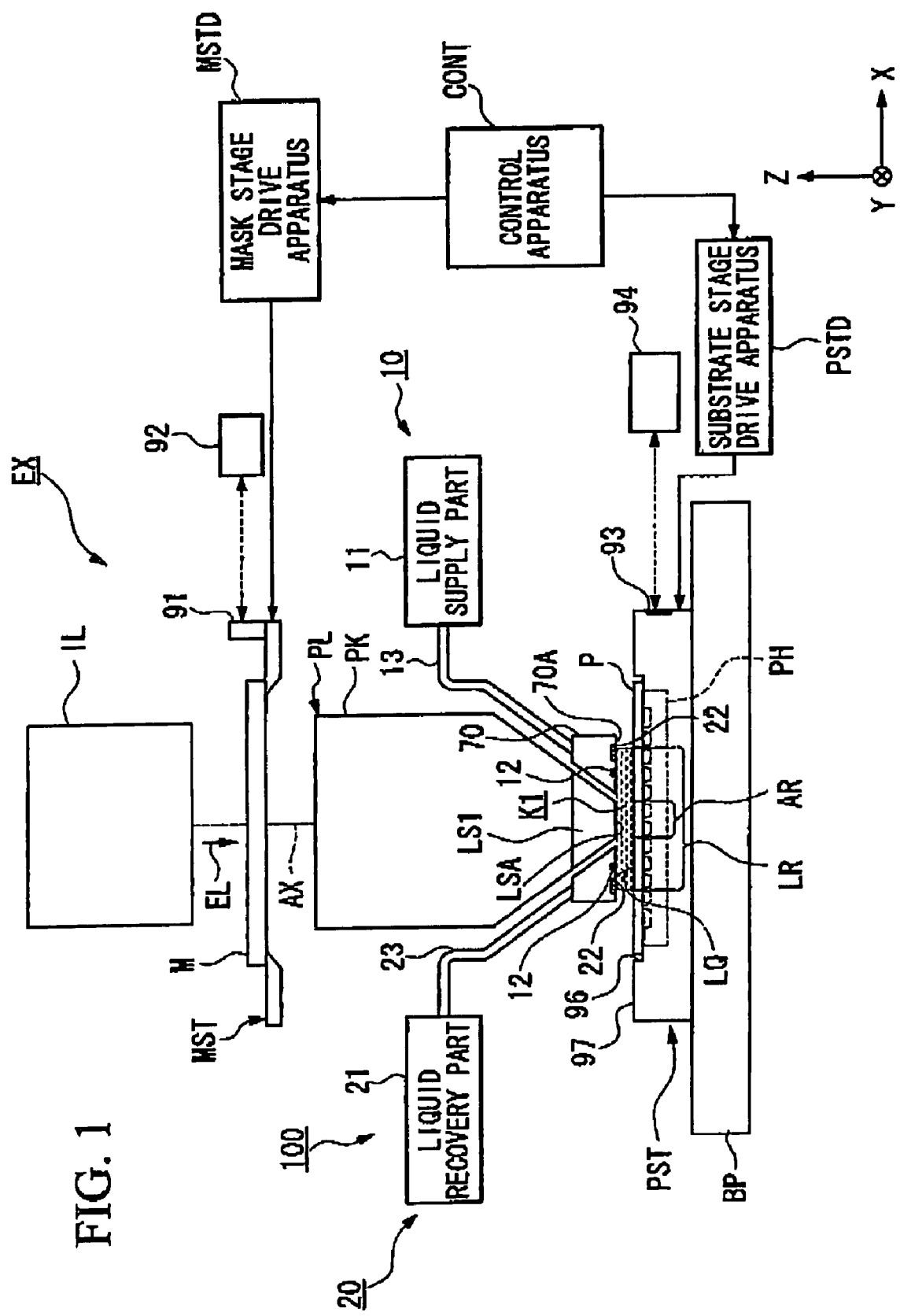
FIG. 1 is a schematic block diagram that shows an embodiment of an exposure apparatus.

First, an embodiment of an exposure apparatus will be explained while referring to FIG. 1. FIG. 1 is a schematic block diagram that shows the exposure apparatus EX, In FIG. 1, the exposure apparatus EX comprises a mask stage MST, which holds a mask M and is able to move, a substrate stage PST, which has a substrate holder PH, which holds a substrate P, and is able to move the substrate holder PH that holds the substrate P, an illumination optical system IL mat uses exposure light EL to illuminate the mask M that is held by the mask stage MST, a projection optical system PL, which projects the pattern image of the mask M illuminated by the exposure light EL onto the substrate P, and a control apparatus CONT, which comprehensively controls the operations of the entire exposure apparatus EX.

The exposure apparatus EX of the present embodiment is a liquid immersion exposure apparatus that applies the liquid immersion method to effectively shorten the exposure wavelength to improve resolution while effectively widening the depth of focus, and it comprises a liquid immersion mechanism 100 for filling the optical path space K1 of the exposure light EL at the image plane side of the projection optical system PL with the liquid LQ. The liquid immersion mechanism 100 comprises a nozzle member 70, which is provided in the vicinity of the image plane of the projection optical system PL and has supply ports 12, which supply the liquid LQ, and a recovery port 22, which recovers the liquid LQ, a liquid supply mechanism 10, which supplies the liquid LQ to the space at the image plane side of the projection optical system PL via the supply ports 12 provided on the nozzle member 70, and a liquid recovery mechanism 20, which recovers the liquid LQ from the space at the image plane side of the projection optical system PL via the recovery port 22 provided on the nozzle member 70. The nozzle member 70 is annularly formed above the substrate P (substrate stage PST) so as to surround a first optical element LS1, which is nearest the image plane of the projection optical system PL among the plurality of optical elements that comprise the projection optical system PL.

The exposure apparatus EX employs a local liquid immersion system that locally forms a liquid immersion area LR of the liquid LQ mat is larger than a projection area AR and smaller than the substrate P on a portion of the substrate P that includes the projection area AR of the projection optical system PL using the liquid LQ supplied from the liquid supply mechanism 10 at least while the pattern image of the mask M is being projected onto the substrate P. Specifically, the exposure apparatus EX fills the optical path space K1 of the exposure light EL between the lower surface LSA of the first optical element LS1, which is nearest the image plane of the projection optical system PL, and the upper surface of the substrate P arranged on the image plane side of the projection optical system PL with the liquid LQ and projects the pattern image of the mask M onto the substrate P via the projection optical system PL and the liquid LQ between this projection optical system PL and the substrate P by irradiating the exposure light EL that has passed through the mask M to the substrate P, and it exposes the substrate P. The control apparatus CONT locally forms the liquid immersion area LR of the liquid LQ on the substrate P by supplying a prescribed amount of the liquid LQ onto the substrate P using the liquid supply mechanism 10 while recovering a prescribed amount of the liquid LQ on the substrate P using the liquid recovery mechanism 20.

In the present embodiment, an explanation win be given which uses as an example the case of a scanning type exposure apparatus (a so-called scanning stepper) that, as the exposure apparatus EX, synchronously moves the mask M and the substrate P in mutually different directions (opposite directions) in the scanning direction while projecting the pattern image formed on the mask M onto the substrate P. In the following explanation, the synchronous movement direction (scanning direction) of the mask M and the substrate P within the horizontal plane is the X axis (direction, the direction perpendicular to the X axis direction within the horizontal plane is the Y axis direction (non-scanning direction), and the direction that is perpendicular to the X axis and Y axis directions and mat matches the optical axis AX of the projection optical system PL is the Z axis direction. In addition, the rotation (tilting) directions about the X axis, the Y axis and the Z axis are the θX, θY and θZ directions respectively. Note that the "substrate" referred to here includes those in which a photosensitive material (resist) has been coated onto a base material such as a semiconductor wafer, and "mask" includes reticles on which a device pattern to be reduction projected onto a substrate has been formed.

The illumination optical system IL has an exposure light source, an optical integrator that evens out the illumination intensity of the light beam that has emerged from the exposure light source, a condenser lens that focuses the exposure light EL from the optical integrator, a relay lens system, and a field stop that sets the illumination area on the mask M resulting from the exposure light EL. The prescribed illumination area on the mask M is illuminated by exposure light EL with an even illumination intensity distribution by means of the illumination optical system IL. Used as the exposure light EL irradiated from the illumination optical system IL are, for example, deep ultraviolet light (DUV light) such as bright lines (g-rays, h-rays, i-rays) mat emerge from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser light is used.

In the present embodiment, pure water is used as the liquid LQ supplied from the liquid supply mechanism 10. Pure water is able to transmit not only ArF excimer laser light but deep ultraviolet light (DUV light) such as bright lines (g-rays, h-rays, i-rays) that emerge from a mercury lamp and KrF excimer laser light (wavelength of 248 nm).

The mask stage MST holds the mask M and is able to move. The mask stage MST holds the mask M by vacuum chucking (or electrostatic chucking). The mask stage MST is capable of two-dimensional movement within a plane perpendicular to the optical axis AX of the projection optical system PL, specifically, within the XY plane, and microrotation in the θZ direction in a status in which the mask M is held by means of the driving of a mask stage drive apparatus MSTD, which includes a linear motor, etc. controlled by the control apparatus CONT. A movable mirror 91 is provided on the mask stage MST. In addition, a laser interferometer 92 is provided at a position that opposes the movable mirror 91. The position of the mask M on the mask stage MST in the two-dimensional direction and the angle of rotation in the θZ direction (also includes the angle of rotation in the θX and θY directions depending on the case) are measured in real time by the laser interferometer 92. The measurement results of the laser interferometer 92 are output to the control apparatus CONT. The control apparatus CONT drives the mask stage drive apparatus MSTD based on the measurement results of the laser interferometer 92 and performs positional control of the mask M held by the mask stage MST.

The projection optical system PL projects the pattern of the mask M onto the substrate P at a prescribed projection magnification β, it comprises a plurality of optical elements, and those optical elements are held by a lens barrel PK. In the present embodiment, the projection optical system PL is a reduction system in which the projection magnification β is ¼, ⅕ or ⅛ for example. Note that the projection optical system PL may be either a magnification system or an enlargement system. In addition, the projection optical system PL may also be any of a refracting system that does not include a reflecting optical element, a reflecting system that does not include a refracting optical element, or a catadioptric system that includes both a reflecting optical element and a refracting optical element. In addition, in the present embodiment, the first optical element LS1, which is nearest the image plane of the projection optical system PL among the plurality of optical elements that comprise the projection optical system PL, can be replaced, and it performs exposure from the lens barrel PK.

The substrate stage PST has a substrate holder PH, which holds the substrate P, and it is able to move on a base member BP on the image plane side of the projection optical system PL. The substrate holder PH holds the substrate P by means of vacuum chucking for example. A concave part 96 is provided on the substrate stage PST, and the substrate holder PH for holding the substrate P is arranged in the concave part 96. Also, the upper surface 97 of the substrate stage PST other than the concave part 96 is a flat surface (flat part) so as to be nearly the same height (flush) as the upper surface of the substrate P held by the substrate holder PH.

The substrate stage PST is capable of two-dimensional movement within the XY plane on the base member BP and microrotation in the θZ direction in a status in which the substrate P is held via the substrate holder PH by means of driving of a substrate stage drive apparatus PSTD that includes a linear motor, etc. controlled by the control apparatus CONT. In addition, the substrate stage PST is also able to move in the Z axis direction, the θX direction and the θY direction. Therefore, the upper surface of the substrate P supported by the substrate stage PST is able to move in directions with six degrees of freedom, which are the X axis, Y axis, Z axis, θX, θY, and θZ directions. A movable mirror 93 is provided at the side surface of the substrate stage PST. In addition, a laser interferometer 94 is provided at a position that opposes the movable mirror 93. The position of the substrate P on the substrate stage PST in the two-dimensional direction and the angle of rotation are measured in real time by laser, interferometer 94. In addition, the exposure apparatus EX comprises a oblique-incidence type focus leveling detection system (not shown in the drawing), which detects surface position information of the upper surface of the substrate P supported by the substrate stage PST, such as that disclosed in Japanese Unexamined Patent Application Publication No. H8-37149. The focus leveling detection system detects surface position information (position information in the Z axis direction and inclination information in the θX and θY directions) of the upper surface of the substrate P. Note that a focus leveling detection system that is of a system that uses an electrostatic capacitance sensor may be employed. The measurement results of laser interferometer 94 are output to the control apparatus CONT. The detection results of the focus leveling detection system are also output to the control apparatus CONT. The control apparatus CONT drives the substrate stage drive apparatus PSTD based on the detection results of the focus leveling detection system and controls the focus position (Z position) and the inclination angle (θX, θY) of the substrate P to align the upper surface or the substrate P with the image plane of the projection optical system PL while performing positional control of the substrate P in the X axis direction, the Y axis direction, and the θZ direction based on die measurement results of laser interferometer 94.

Next, the liquid simply mechanism 10 and the liquid recovery mechanism 20 of the liquid immersion mechanism 100 will be explained. The liquid supply mechanism 10 is for supplying the liquid LQ to the space at the image plane side of the projection optical system PL, and it comprises a liquid supply part 11, which is able to deliver the liquid LQ, and supply pipes 13, one end portion of which is connected to the liquid supply part 11. The other end portions of the supply pipes 13 are connected to the nozzle member 70. Internal flow paths (supply flow paths) that connect the other end portions of the supply pipes 13 and the supply ports 12 are formed at the interior of the nozzle member 70. The liquid supply part 11 comprises a tank, which accommodates the liquid LQ, a pressurization pump, a temperature adjustment mechanism, which adjusts the temperature of the supplied liquid LQ, and a filter unit, which removes foreign matter in the liquid LQ. The liquid supply operation of the liquid supply part 11 is controlled by the control apparatus CONT. Note that the exposure apparatus EX is not necessarily equipped with all of the tank, acceleration pump, temperature adjustment mechanism, filter unit, etc. of the liquid supply mechanism 10, and it is also possible to substitute equipment such as that of the plant where the exposure apparatus EX is to be installed.

The liquid recovery mechanism 20 is for recovering the liquid LQ from the space of the image plane side of the projection optical system PL, and it comprises a liquid recovery part 21 that is able to recover the liquid LQ and a recovery pipe 23, one end of which connects to the liquid recovery part 21. The other end of the recovery pipe 23 is connected to the nozzle member 70. An internal flow path (recovery flow path) that connects the other end part of the recovery pipe 23 and a recovery port 22 is formed at the interior of the nozzle member 70. The liquid recovery part 21 comprises, for example, a vacuum system (suction apparatus) such as a vacuum pump, a gas-liquid separator, which separates the recovered liquid LQ and gas, and a tank, which accommodates the recovered liquid LQ. Note that, the exposure apparatus EX is not necessarily equipped with all of the vacuum system, gas-liquid separator, tank, etc. of the liquid recovery mechanism 20, and it is also possible to substitute equipment such as that of the plant where the exposure apparatus EX is to be installed.

The supply ports 12, which supply the liquid LQ, and the recovery port 22, which recovers the liquid LQ, are formed at the lower surface 70A of the nozzle member 70. The lower surface 70A of the nozzle member 70 is provided at a position that opposes the upper surface of the substrate P and the upper surface 97 of the substrate stage PST. The nozzle member 70 is an annular member provided so as to surround the side surface of the first optical element LS1. The supply ports 12 are plurally provided so as to surround the first optical element LS1 of the projection optical system PL (the optical axis AX of the projection optical system PL) at the lower surface 70A of the nozzle member 70. In addition, the recovery port 22 is provided further to the outside than the supply ports 12 with respect to the first optical element LS1 so as to surround the first optical element LS1 and the supply ports 12 at the lower surface 70A of the nozzle member 70.

In addition, the control apparatus CONT fills the optical path space K1 of the exposure light EL between the projection optical system PL and substrate P with the liquid LQ and locally forms the liquid immersion area LR of the liquid LQ on the substrate P by supplying a prescribed amount of the liquid LQ onto the substrate P using the liquid supply mechanism 10 while recovering a prescribed amount of the liquid LQ on the substrate P using the liquid recovery mechanism 20. When the liquid immersion area LR of the liquid LQ is formed, the control apparatus CONT drives the liquid supply part 11 and the liquid recovery part 21 respectively. When the liquid LQ is delivered from the liquid supply part 11 under the control of the control apparatus CONT, after that liquid LQ delivered from the liquid supply part 11 has flowed through the supply pipes 13, it is supplied to the image plane side of the projection optical system PL from the supply ports 12 via the simply flow paths of the nozzle member 70. In addition, when the liquid recovery part 21 is driven under the control of the control apparatus CONT, the liquid LQ at the image plane side of the projection optical system PL is recovered by the liquid recovery part 21 after it has flowed into the recovery flow path of the nozzle member 70 via the recovery port 22 and flowed through the recovery pipe 23.

When liquid immersion exposure of the substrate P is performed, the control apparatus CONT uses the liquid immersion mechanism 100 to fill the optical path space K1 of the exposure light EL between the projection optical system PL and substrate P supported by the substrate stage PST and performs exposure of the substrate P by irradiating die exposure light EL onto the substrate P via the projection optical system PL and the liquid LQ.

Substrate

Figure 2:
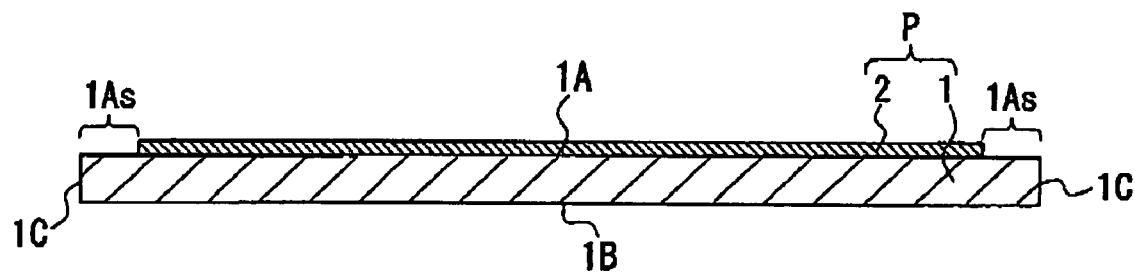
FIG. 2 is across sectional view that shows an embodiment of a substrate.

Next, an example of the substrate P subject to exposure will be explained while referring to FIG. 2. In FIG. 2, the substrate P has a base material 1 and a photosensitive material 2, which is coated onto a portion of the upper surface 1A of mat base material 1. The base material 1 includes, for example, silicon wafers (semiconductor wafers). The photosensitive material 2 is coated at a prescribed thickness (for example, approximately 200 nm) in an area that takes up nearly all of the center part of the upper surface 1A of the base material 1. On the other hand, the photosensitive material 2 is not coated on the peripheral part 1As of the upper surface 1A of the base material 1, and the base material 1 is exposed at that peripheral part 1As of the upper surface 1A. In addition, the photosensitive material 2 is not coated on the side surface 1C and the lower surface (rear surface) 1B of the base material 1. In the present embodiment, a chemically amplified resist is used as the photosensitive material 2. The chemically amplified resist includes a base resin, a photo acid generator (PAG) included in the base resin, and an amine group substance called a quencher.

The photosensitive material 2 is coated onto the base material 1 by a prescribed coating method such as the spin coating method. In the case where a photosensitive material 2 is provided on the base material 1 by a prescribed coating method such as the spin coating method, the photosensitive material 2 is unfortunately also coated onto the peripheral part of base material 1. This portion comes into contact with the conveyance arm of the conveyance system that conveys the substrate P and support parts such as the shelf, etc. of the carrier that stores the substrate P. Due to this mechanical contact, there is concern that the photosensitive material 2 will peel. When the photosensitive material 2 peels, it becomes foreign matter, and there is a possibility that not only will the conveyance arm and the carrier be contaminated but that contamination will increase by those contaminants again coming into contact with the clean substrate P. In addition, there are cases in which a phenomenon whereby the photosensitive material 2 is coated in large quantity so as to heap up from the center part at the peripheral part of the base material 1. The photosensitive material 2 of that peripheral part of the base material 1 is likely to peel, and the peeled photosensitive material 2 becomes foreign matter, and when mat foreign matter adheres onto the substrate P, it has an effect on pattern transfer accuracy. Therefore, after the photosensitive material 2 has been provided by a prescribed coating method onto the base material 1 and before exposure processing is performed, processing that removes the photosensitive material 2 of the peripheral part 1As using a solvent for example (so-called edge rinse treatment) is performed. Through this, the photosensitive material 2 at the peripheral part of the base material 1 (substrate P) is removed, and, as shown in FIG. 2, the base material 1 is exposed at that peripheral part 1As.

First Embodiment of the Exposure Method

Figure 3:
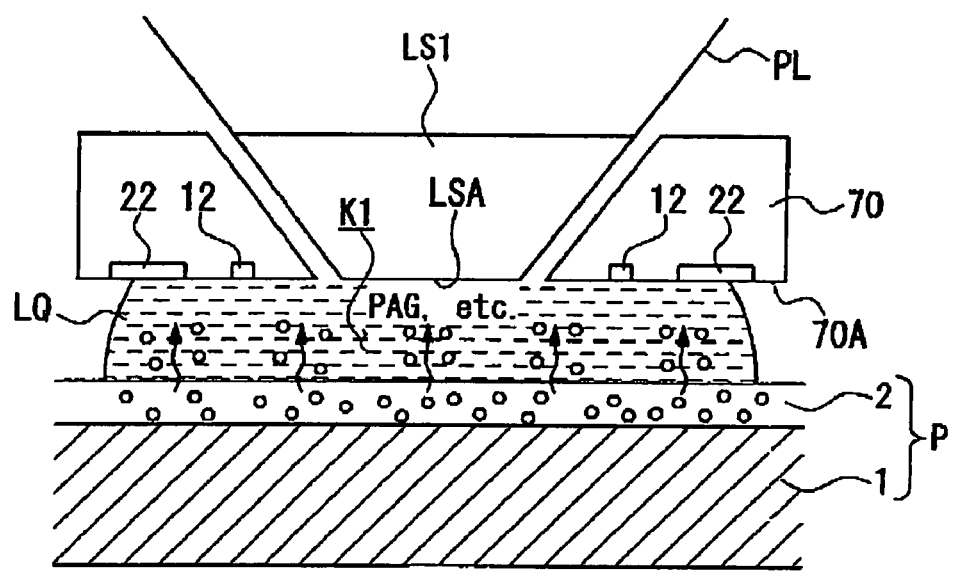
FIG. 3 is a drawing for explaining a condition in which the eluted substance is eluted from the substrate to the liquid.

Next, the method of exposing the substrate P based on the liquid immersion method will be explained. FIG. 3 is a drawing that shows a status in which the liquid LQ has been filled into the optical path space K1 of die exposure light EL between the projection optical system PL and die substrate P. As shown in FIG. 3, in a case where the substrate P is exposed based on the liquid immersion method, the liquid LQ is arranged on the substrate P. The photosensitive material 2 of the present embodiment is a chemically amplified resist, and, as discussed above, it includes a base resin, a photo acid generator (PAG) included in the base resin, and an amine group substance called a quencher. When such a photosensitive material 2 comes into contact with the liquid, a partial component of the photosensitive material 2, specifically, the HAG or the amine group substance, etc., is eluted into the liquid LQ. In the following explanation, the substance eluted into the liquid LQ from the substrate P (PAG or the amine group substance, etc.) will be referred to as "the eluted substance" as appropriate. Note that "the eluted substance" is not limited to PAG and amine group substances but may also be another substance included in the photosensitive material 2. For example, "the eluted substance" may also include anions.

Figure 4A:
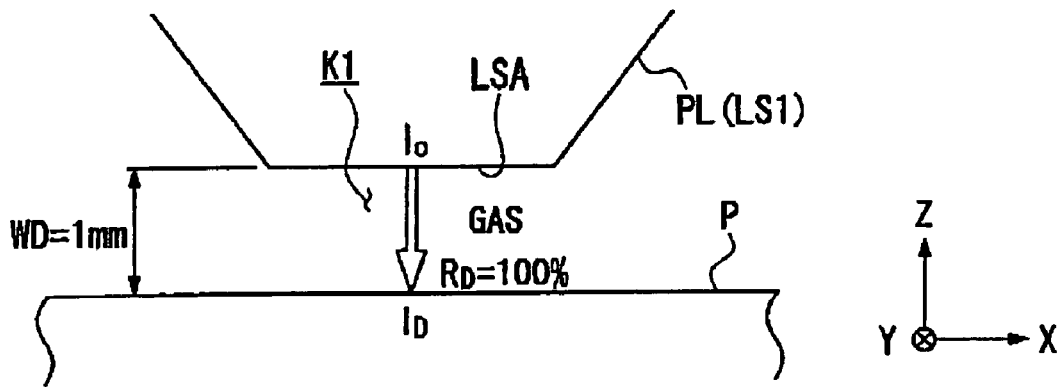
FIG. 4A is a drawing for explaining the relationship between the transmittance and a medium that has been filled into the optical path space.
Figure 4B:
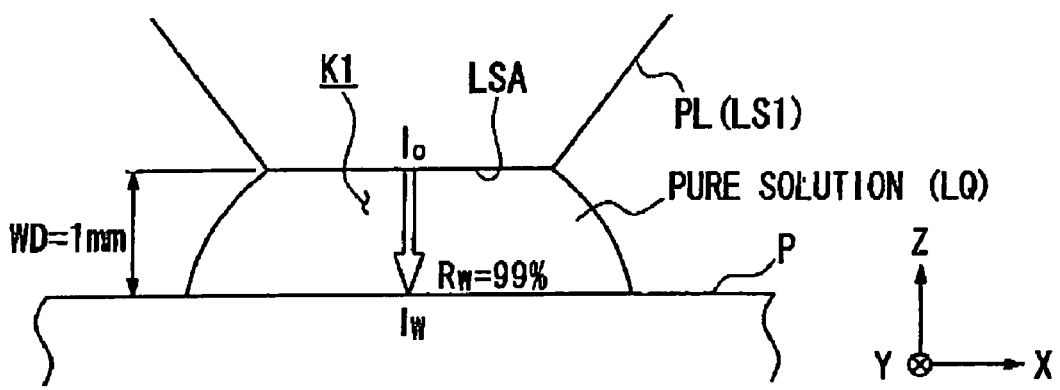
FIG. 4B is a drawing for explaining the relationship between the transmittance and a medium that has been filled into the optical path space.
Figure 4C:
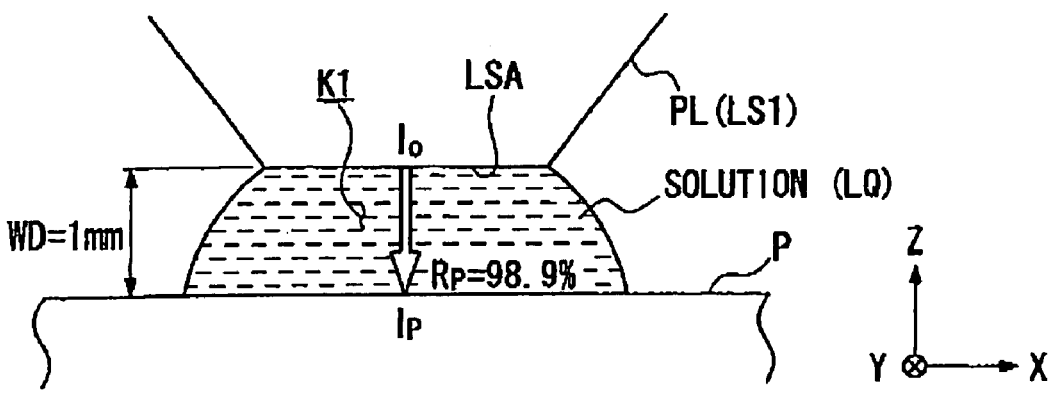
FIG. 4C is a drawing for explaining the relationship between the transmittance and a medium mat has been filled into the optical path space.

FIGS. 4A to 4C are schematic views that show the relationship between a medium that has been filled into the optical path space K1 of the exposure light EL between the projection optical system PL and the substrate P, and the transmittance of that medium. In the following explanation, the distance (working; distance) WD between the lower surface LSA of the projection optical system PL (first optical element LS1) and the upper surface of the substrate P is set to 1 mm, and the exposure light EL progresses through a medium with a thickness of 1 mm that has been filled into the optical path space K1 between the lower surface LSA of the projection optical system PL and substrate P along the Z axis direction. In addition, the thickness direction of the medium that has been filled into the optical path space K1 and the Z axis direction nearly match, and the optical path direction (progress direction) of the exposure light EL and the Z axis direction are nearly parallel. Specifically, the exposure light EL progresses through a medium with a thickness of 1 mm that has been filled into the optical path space K1 between the lower surface LSA of the projection optical system PL and the substrate P along the thickness direction thereof (the Z axis direction, the optical axis direction of the exposure light EL).

FIG. 4A is a drawing that shows a status in which a gas (air) has been filled into the optical path space K1 between the projection optical system PL and the substrate P. In FIG. 4A, the amount of light of the exposure light EL when it has been is incident to the medium of the optical path space K1 between the projection optical system PL and the substrate P, in other words, the amount of light of the exposure light EL when it has emerged from the lower surface LSA of the projection optical system PL is $I_0$, and the amount of light of the exposure light EL when it has emerged from the medium (gas) of the optical path space K1, in other words, the amount of tight of the exposure light EL when it has reached onto the substrate P, is $I_D$. Amount of light $I_D$ is the amount of light of the exposure light EL after it has passed through a gas with a thickness of 1 mm that has been filled into the optical path space K1. When the transmittance of that gas with a thickness of 1 mm with respect to the exposure light EL is $R_D$, $R_D = I_D / I_D$. Here, ideally, transmittance $R_D = 100\%$ is set.

FIG. 4B is a drawing that shows a status in which a liquid LQ has been filled into the optical path space K1 between the projection optical system PL and the substrate P. The liquid LQ in FIG. 4B is the liquid before an eluted substance such as PAG has been eluted from the substrate P, and it is maintained at a nearly ideal degree of cleanliness. In the following explanation, the clean liquid LQ prior to the eluted substance being eluted, specifically, the liquid LQ that does not include the eluted substance, is referred to as "the pure solution" as appropriate. In FIG. 4B, the amount of light of the exposure light EL when it was incident to the medium (pare solution) of the optical path space K1 between the projection optical system PL and the substrate P, in other words, the amount of light of the exposure light EL when it has emerged from the lower surface LSA of the projection optical system PL, is $I_0$, and die amount of light of the exposure light EL when it has emerged from in the medium (pure solution) of the optical path space K1, in other words, the amount of light of the exposure light EL when it has reached onto the substrate P, is $I_W$. Amount of light $I_W$ is the amount of light of the exposure light EL after it has passed through the pure solution with a thickness of 1 mm that has been filled into the optical path space K1. When the transmittance of that pure solution with a thickness of 1 mm with respect to the exposure light EL is $R_W$, $R_W=I_W/I_0$.

As discussed above, in the present embodiment, pure water is used as the liquid LQ, and the transmittance of a pure solution with a thickness of 1 mm (transmittance of die pure solution per 1 mm) $R_W$ is approximately 99%. In other words, in the present embodiment, the light absorption ratio of the pure solution with a thickness of 1 mm is approximately 1%. Specifically, in the present embodiment, even in the case where the optical path space K1 has been filled with a liquid (pure solution) that has an ideal degree of cleanliness, the transmittance $R_W$ at that time is reduced by approximately 1% with respect to the transmittance $R_D$ in the case in which the optical path space K1 has been filled with gas ($R_D-R_W=1\%$).

FIG. 4C is also a drawing that shows a status in which a liquid LQ has been filled into the optical path space K1 between the projection optical system PL and the substrate P. The liquid in FIG. 4C is a liquid that includes an eluted substance such as PAG that has been eluted from the substrate P. In the explanation below, the liquid that includes the eluted substance is referred to as "the solution" as appropriate, ha FIG. 4C, the amount of light of the exposure light EL when it was incident to the medium (solution) of the optical path space K1 between the projection optical system PL and substrate P, in other words, the amount of light of the exposure light EL when it has emerged from the lower surface LSA of the projection optical system PL, is $I_0$, and the amount of light of the exposure light EL when it has emerged from the medium (solution) of the optical path space K1, in other words, the amount of light of the exposure light EL when it has reached onto the substrate P, is $I_P$. Amount of light $I_P$ is the amount of light of the exposure light EL after it has passed through a solution with a thickness of 1 mm that has been filled into the optical path space K1. When the transmittance of that pure solution with a thickness of 1 mm with respect to the exposure light EL is $R_P$, $R_P=I_P/I_0$.

In the case in which an eluted substance such as PAG has been eluted from the substrate P into the liquid LQ that has been filled into the optical path space K1, the concentration Dn of the eluted substance in the liquid LQ rises. The transmittance $R_P$ of the liquid LQ that has been filled into the optical path space K1 with respect to the exposure light EL changes according to the concentration Dn of the eluted substance in toe liquid LQ, and the transmittance $R_P$ of the liquid LQ falls in conjunction with the rise in the concentration Dn. Therefore, the transmittance $R_P$ of the solution becomes smaller than the transmittance $R_W$ of the pure solution. In other words, the light absorption ratio of the solution that includes the eluted substance is larger than the light absorption ratio of the pure solution.

In the case where the exposure light EL has been irradiated to the liquid LQ that has been filled into the optical path space K1, there is a possibility that the temperature of the liquid LQ will rise due to the fact that the energy of the exposure light EL that passes through or the energy of the exposure light EL that has been reflected by the substrate P is absorbed. The amount of temperature rise of the liquid LQ varies according to the transmittance of the liquid LQ. In the case where the transmittance of the liquid LQ is small, the amount of temperature rise (amount of temperature change) of the liquid LQ becomes larger. In the case where the liquid LQ that has been filled into the optical path space K1 has risen in temperature (changed in temperature), the refractive index of the liquid LQ with respect to the exposure light EL changes. When the refractive index of the liquid LQ that has been filled into the optical path space K1 with respect to the exposure light EL changes, the image formation characteristics via the projection optical system PL and the liquid LQ fluctuate (deteriorate), such as in the focus position fluctuating or aberration occurring. In addition, when a temperature distribution occurs in the liquid LQ, a refractive index distribution occurs in conjunction with this, and this refractive index distribution also leads to image formation characteristics via the projection optical system PL and the liquid fluctuating (deteriorating). In addition, there is a possibility that, in conjunction with a temperature rise (temperature change) of the liquid LQ that has been filled into the optical path space K1, the temperature of the first optical element LS1 that comes into contact with the liquid LQ will also change, and there is a possibility that a nonconformity such as, for example, the first optical element LS1 thermally deforming will occur. Therefore, in the liquid immersion method, it is important to restrict the occurrence of temperature rises (temperature changes) and temperature distributions of the liquid LQ that has been filled into the optical path space K1. For this reason, it is preferable that the transmittance of the liquid LQ mat has been filled into the optical path space K1 be made as large as possible.

Therefore, it is preferable that the concentration Dn of the eluted substance in the liquid LQ mat has been filled into the optical path space K1 be reduced, and it is important that the concentration Dn of the eluted substance in the liquid LQ be managed to restrict the occurrence of temperature rises (temperature changes) or temperature distributions of the liquid LQ that has been filled into the optical path space K1. As discussed above, the transmittance $R_P$ of the liquid LQ with respect to the exposure light EL changes according to the concentration Dn of the eluted substance in the liquid LQ, so by setting the allowable concentration Dn of the eluted substance in the liquid LQ based on the transmittance $R_P$ of the liquid LQ with respect to the exposure light EL that has been filled into the optical path space K1 of the exposure light EL, it is possible to restrict temperature rises (temperature changes) of the liquid LQ and to maintain the image formation characteristics via the projection optical system PL and the liquid LQ in a desired state. In the present embodiment, by determining in advance the allowable concentration Dnr of the eluted substance in the liquid LQ based on the transmittance $R_P$ of the liquid LQ with respect to the exposure light EL in the optical path space K1 and maintaining the concentration Dn of the eluted substance in the liquid LQ mat has been filled into the optical path space K1 at the allowable concentration Dnr or less, the image formation characteristics via the projection optical system PL and the liquid LQ are maintained in a desired state.

In the present embodiment, when the transmittance per 1 mm of pure solution is $R_W$, and the transmittance per 1 mm of solution is $R_P$, die concentration Dn (allowable concentration Dnr) of the eluted substance in die liquid LQ that is arranged on the substrate P is set so as to satisfy the following condition $$R_W-R_P \leq 1.0\times10^{-3} \qquad (1).$$

In FIG. 4C, the concentration Dn (allowable concentration Dnr) of the eluted substance in the liquid LQ is set so that the transmittance $R_P$ becomes 98.9% or more. Specifically, a substrate in which a film of a photosensitive mated all is formed on the surface so that the allowable concentration Dnr is satisfied is loaded onto the substrate stage PST as the substrate P subject to exposure, and a liquid immersion area LR is formed on that substrate P. By doing this, even in the case in which the exposure light EL has been irradiated, it is possible to restrict the occurrence of temperature rises (temperature changes) or temperature distributions of the liquid LQ that has been filled into the optical path space K1, and it is possible to maintain the image formation characteristics via the projection optical system PL and the liquid LQ. In addition, by restricting the concentration Dn of die eluted substance in the liquid LQ to die allowable concentration Dnr or less, it is also possible to restrict the members that come into contact with the liquid LQ from among the various members comprising the exposure apparatus EX, specifically, the first optical element LS1, the nozzle member 70, etc., from becoming contaminated due to the eluted substance. In addition, contamination of the first optical element LS1 is restricted, so it is possible to cause the exposure light EL to preferably reach the substrate P. In addition, in the case in which the first optical element LS1 has become contaminated, it is conceivable that maintenance treatment such as cleaning the first optical element LS1 or replacing it with a new one that is not contaminated would be performed, but, by restricting the contamination of the first optical element LS1, it is possible to reduce the number of rimes maintenance treatment is performed. In addition, since it is possible to restrict energy drops of the exposure light EL mat reaches the substrate P, it is possible to prevent reductions in the throughput of the exposure apparatus EX.

In general, liquid has a larger optical absorption coefficient than gas and is more likely to change temperature. In addition, the temperature dependency of changes in the refractive index of the liquid with respect to the exposure light EL is markedly larger than the temperature dependency of changes in the refractive index of the gas. For example, the amount of change in the refractive index of pure water in the case where a temperature change of 1° C. has occurred is said to be approximately 120 times larger than the amount of change in the refractive index of air. In addition, the temperature dependency of changes is the refractive index of the liquid is larger than the temperature dependency of changes in the refractive index of the first optical element LS1, which consists of quartz, etc. Specifically, even if the amount of temperature change (amount of temperature rise) of the liquid LQ that has been filled into the optical path space K1 is slight, the refractive index of the liquid LQ with respect to the exposure light EL will unfortunately greatly change. For this reason, in order to obtain the desired image formation characteristics, it is important to adequately restrict temperature changes of the liquid LQ mat has been filled into the optical path space K1. In the present embodiment, by setting in advance the allowable concentration Dnr of the eluted substance in the liquid LQ that has been arranged on the substrate P so as to satisfy the condition of Equation (1) above and restricting the concentration Dn of the eluted substance in the liquid LQ to an allowable concentration Dnr or less, it is possible to restrict temperature changes accompanying transmittance changes of the liquid LQ and to maintain the desired image formation characteristics.

In addition, as discussed above, in the case in which an eluted substance such as PAG is included in the liquid LQ that has been filled into the optical path space K1, there is a possibility of the occurrence of a nonconformity such as that in which the first optical element LS1 that comes into contact with that liquid LQ becomes contaminated and clouding occurs. In addition, due to the exposure light EL being irradiated to that liquid LQ that has been filled into that optical path space K1, there is a possibility that contamination (clouding) of the first optical element LS1 that comes into contact with the liquid LQ will progress due to a photochemical reaction. As in the present embodiment, it is also possible to prevent the occurrence of contamination (clouding) such as that discussed above by adequately restricting the concentration Dn of due eluted substance that includes PAQ etc. in the liquid LQ.

The allowable concentration Dnr for satisfying the conditions of the Equation (1) above can be obtained by, for example, experimentation or simulation. In addition, there is a possibility that the transmittance $R_P$ of the liquid (solution) LQ will change it according to die characteristics of the eluted substance (physical properties, type), so it is preferable that the allowable concentration Dnr be set according to the characteristics of the photosensitive material 2 that includes PAQ etc. For example, in the case where a solution that contains a first eluted substance that has a first characteristic is considered the first solution and a solution that contains a second eluted substance that has a second characteristic is considered the second solution, there will be cases in which the transmittance $R_{P1}$ of the first solution and the transmittance $R_{P2}$ of the second solution will be mutually different even if the concentration $Dn_1$ of the first eluted substance in the first solution is the same value as the concentration $Dn_2$ of the second eluted substance in the second solution. In the case in which concentration $Dn_1$ and concentration $Dn_2$ are the same value, and, for example, the transmittance $R_{P1}$ of the first solution is higher than the transmittance $R_{P2}$ of the second solution, it is possible to set the allowable concentration Dnr relating to the first solution to a high value. Specifically, even if the concentration $Dn_1$ of the first eluted substance in the first solution is made higher than the concentration $Dn_2$ of the second eluted substance in the second solution (even if the first solution is made more concentrated), the first solution will be able to achieve the desired transmittance $R_P$ ($R_{P1}$) that would satisfy Equation (1) above.

In this way, it is possible to optimally set the allowable concentration Dnr according to information relating to the photosensitive material 2, such as the characteristics of the photosensitive material (including PAG and amine) and the compositions of the substances included in the photosensitive material 2. In addition, as shown in FIG. 2, in the case in which the liquid LQ has come into contact with the peripheral part 1As of the base material 1, there is a possibility that a substance will be eluted into the liquid LQ from the base material 1. In addition, there is a possibility that the transmittance $R_P$ of the liquid (solution) LQ will change due to eluted substance (including silicon) that has been eluted from the base material 1. In that case as well, there is a possibility that the transmittance $R_P$ of the liquid LQ will change according to the characteristics (physical properties, type) of the base material 1. Therefore, by setting the allowable concentration Dnr according to information relating to the substrate P, which includes the photosensitive material 2 and the base material 1, and setting the concentration Dn so that it is at or below that allowable concentration Dnr, it is possible to satisfy the condition of Equation (1) above and to set the image formation characteristics via the projection optical system PL and the liquid LQ to a desired state.

Then, as discussed above, it is possible to set the concentration Dn so as to satisfy the condition of Equation (1) above by performing prescribed processing such as immersion processing on the substrate P.

Note that, here, the explanation has had as its premise the use of a pure solution as the liquid that has an ideal degree of cleanliness as well as the fact that the liquid supply mechanism 10 is able to supply that ideal liquid, but the degree of cleanliness of the pure solution changes according to such factors as die capabilities of the liquid supply mechanism 10. Specifically, the transmittance $R_W$ is determined according to the liquid supply mechanism 10 (the capabilities of die liquid supply mechanism 10, for example, the degassing capabilities, etc.), and there is a possibility that the transmittance $R_W$ will not become approximately 99% depending on the capabilities of the) liquid supply mechanism 10. In such a case as well, by setting the concentration Dn of the eluted substance in the solution so as to satisfy Equation (1) above with respect to the transmittance $R_W$ that corresponds to the liquid supply mechanism 10 (the capabilities of the liquid supply mechanism 10), it is possible set the image formation characteristics via the projection optical system PL and the liquid LQ to a desired state.

Second Embodiment of the Exposure Method

In any case, in the first embodiment discussed above, the concentration Dn of the eluted substance in the liquid LQ is set so as to satisfy the condition of Equation (1) in order to restrict the occurrence of temperature rises (temperature changes) or temperature distributions of the liquid LQ that has been filled into the optical path space K1. However, the condition of Equation (1) does not take into account such factors as the flow of the liquid LQ that is filled into the optical path space K1. As was explained while referring to FIG. 1, etc., the exposure apparatus EX uses the liquid immersion mechanism 100 to perform operations of simply and recovery of the liquid LQ with respect to the optical path space K1 during irradiation of the exposure) light EL. In addition, during irradiation of the exposure light EL, the substrate P is moved with respect to the optical path space K1. A flow occurs in the liquid LQ that has been filled into the optical path space K1 according to the operations of supply and recovery of the liquid LQ by the liquid immersion mechanism 1 and the movement, etc. of the substrate P. It was found that the liquid LQ of the optical path space K1 cools due to that produced flow of the liquid LQ. Therefore, it was found that, even if the transmittance $R_P$ of die liquid LQ of the optical path space K1 drops due to the eluted substance such as PAG, temperature rises of the liquid LQ that has been filled into the optical path space K1 will be restricted due to the cooling effect resulting from the flow of the liquid LQ.

Therefore, it was found that, when the transmittance per 1 mm of pure solution is $R_W$, and the transmittance per 1 mm of solution is $R_P$, even in the case in which the concentration Dn (allowable concentration Dnr) of the eluted substance in the liquid LQ that has been arranged on the substrate P has been set so as to satisfy the condition $$R_W - R_P \leq 1.0 \times 10^{-2} \qquad (1'),$$

it is possible to restrict the occurrence of temperature rises (temperature changes) or temperature distributions of the liquid LQ mat has been filled into the optical path space K1 and maintain the image formation characteristics via the projection optical system PL and the liquid LQ due to the cooling effect resulting from the flow of the liquid LQ. For example, in FIG. 4C, the concentration Dn (allowable concentration Dnr) of the eluted substance in the liquid LQ is set so that the transmittance $R_P$ becomes 98% or higher.

In addition, the cooling effect resulting from the flow of the liquid LQ changes according to the operations of supply and recovery of the liquid LQ and the movement velocity, etc. of the substrate P, so it is possible to optimally set the allowable concentration Dnr for satisfying the condition of Equation (1') above by, for example, experimentation or simulation while taking into account the amount of supply and the amount of recovery of the liquid per unit time or the movement velocity, etc. of the substrate P. For example, in the case in which the movement velocity of the substrate P has been increased, it is possible to set the allowable concentration Dnr to a relatively high value within a range which satisfies the condition of Equation (1'). In addition, since there is a possibility that the transmittance $R_P$ of the liquid (solution) LQ will change according to the characteristics (physical properties, type) of the eluted substance, it is possible to optimally set the allowable concentration Dnr according to information relating to die photosensitive material 2.

In addition, as discussed above, it is possible to set the concentration Dn so as to satisfy the condition of Equation (1') above by employing a photosensitive material in which elution of the substance is restricted or by performing the prescribed processing, such as liquid immersion processing, on the substrate P.

Third Embodiment of the Exposure Method

As discussed above, in the case where an eluted substance is included in the liquid LQ that has been filled into the optical path space K1, there is a possibility that the liquid contact surface (lower surface) LSA of the first optical element LS1 that comes into contact with the liquid LQ will become contaminated (clouded), and there is a possibility that the degree of that clouding will become larger over time due to irradiation of the exposure light EL. When the lower surface LSA of the first optical element LS1 becomes clouded, there is concern that this will bring about a decrease in the transmittance of the exposure light EL of the first optical element LS1, absorption of the energy of the irradiated exposure light EL, thermal deformation of the first optical element LS1, etc. Therefore, it is necessary to restrict the occurrence of clouding as much as possible. The amount of die reduction of the transmittance) of the exposure light EL attributable to clouding (contamination) of the first optical element LS1 (the degree of the clouding of the first optical element LS1) changes according to the concentration of the eluted substance in the liquid LQ. Therefore; the concentration Dn (allowable concentration Dnr) of the liquid LQ on the substrate P, specifically, the eluted substance in the liquid LQ that has been filled into the optical path space K1, may be set based on the transmittance of the lower surface LSA of the first optical element LS1. Specifically, die concentration Dn (allowable concentration Dnr) of the eluted substance in the liquid LQ is set so that the amount of reduction of the transmittance attributable to clouding of the lower surface LSA of the first optical element LS1 satisfies conditions determined in advance.

In the present embodiment, when the transmittance of the liquid contact surface LSA of the first optical element LS1 at a first point in time is $R_G$, and the transmittance of the liquid contact surface LSA of the first optical element LS1 at a second point in time after a prescribed time has elapsed (for example, one year after) from the first point in time after coming in contact with the liquid LQ that includes the eluted substance is $R_G'$, the concentration Dn (allowable concentration Dnr) of the eluted substance in the liquid LQ is set so as to satisfy the following condition $$R_G - R_G' \leq 1.0 \times 10^{-3} \qquad (2).$$

By setting the concentration Dn (allowable concentration Dnr) of the eluted substance in the liquid LQ so as to satisfy the condition of Equation (2) above, it is possible to prevent nonconformities such as those in which the first optical element LS1 thermally deforms due to clouding, or the image formation characteristics via the projection optical system PL and the liquid LQ fluctuate (deteriorate).

In any case, for example, it is conceivable that, even if the concentration Dn of the eluted substance in the liquid LQ were set so as to satisfy the conditions of Equations (1) and (1') above, in other words, even if the amount of the eluted substance eluted into the liquid LQ from the substrate P (photosensitive material 2) were restricted so as to satisfy Equations (1) and (1'), the lower surface LSA of the first optical element LS1 would cloud, and it would not be possible to satisfy Equation (2).

Figure 5:
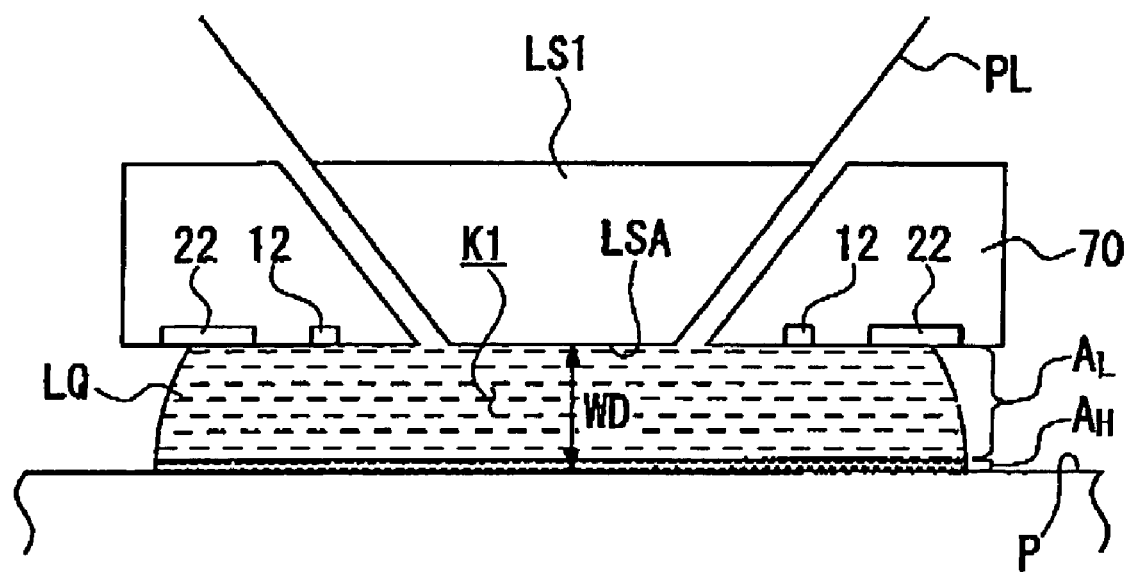
FIG. 5 is a drawing for explaining the concentration distribution of an eluted substance in a liquid that has been filled into the optical path space.

In addition, in the first and second embodiments discussed above, Equations (1) and (1') were calculated with a premise of die fact that die concentration Dn in the liquid LQ that has been filled into the optical path space K1 is nearly uniform along the optical path direction (Z axis direction) of the exposure light EL. However, this does not mean that the eluted substance that has been eluted from the substrate P is uniformly diffused in the liquid LQ instantly, and, as shown in FIG. 5, a high concentration area $A_H$ is formed in the vicinity of the surface of the substrate P. On the other hand, even in a status in which a high concentration area $A_H$ of the eluted substance is formed in the vicinity of the surface of the substrate P, a low concentration area $A_L$ of the eluted substance is formed in the vicinity of the lower surface LSA of the first optical element LS1, which is the liquid contact surface of the projection optical system PL. Here, the thickness (size in the Z axis direction) of die high concentration area $A_H$ is thin at, for example, approximately 0.1 mm. On the other hand, the thickness of the low concentration area $A_L$ is thick and takes up a large portion of the working distance WD.

Specifically, in the first and second embodiments, the average concentration of die eluted substance in the liquid LQ when a prescribed amount of the eluted substance was eluted into the liquid LQ from the substrate P was considered to be Dn, but the concentration $Dn_L$ of the eluted substance in the liquid LQ of the low concentration area $A_L$, which includes the concentration of die eluted substance in the liquid LQ in the vicinity of the lower surface LSA of the first optical element LS1, becomes a value that is considerably smaller than the average concentration Dn. Specifically, when $Dn_L = R \times Dn$, $R<1$ results. On the other hand, the concentration $Dn_H$ of the eluted substance in the liquid LQ of the high concentration area $A_H$ becomes a value that is higher than the average concentration Dn.

Therefore, since only the liquid LQ (a solution with a low concentration) of the low concentration area $A_L$ comes into contact with the liquid contact surface LSA of the first optical element LS1, it is possible to restrict the occurrence of clouding of the liquid contact surface LSA of the first optical element LS1 even when the average concentration Dn of the liquid LQ is at a relatively high value.

Therefore, it was found that it was possible to restrict clouding of the first optical element LS1 by setting the amount (allowable amount) of PAG eluted into the liquid LQ from the substrate P by coming into contact with the liquid LQ to 2.2 ng/cm$^2$ or less while setting the amount (allowable amount) of the amine group substance eluted into the liquid LQ from the substrate P to 1.1 ng/cm$^2$ or less.

In addition, the concentration $Dn_L$ of the eluted substance in the liquid LQ of the low concentration area $A_L$ fluctuates according to, for example, the movement velocity (scan velocity) of the substrate P (substrate stage PST). Specifically, as shown in the schematic drawing of FIG. 16, shear force is generated in the lower layer area (specifically, the high concentration area $A_H$) of the liquid LQ in conjunction with the movement of the substrate P, and the eluted substance that is present in the high concentration area $A_H$ moves to the recovery port 22, so it is possible to quickly recover that eluted substance via the recovery port 22 before the eluted substance that is present in the high concentration area $A_H$ expands to the vicinity of die lower surface LSA of the first optical element LS1 by increasing the movement velocity of the substrate P. Therefore, it is possible to restrict the rise in the concentration $Dn_L$ of the low concentration area $A_L$ in the liquid LQ. As an example, a result was obtained in which the concentration $Dn_L$ of the low concentration area $A_L$ became approximately 1/73 (R=1/73) as a result of performing supply and recovery of the liquid LQ with respect to the optical path space K1 using a prescribed nozzle member while performing simulation of the case in which the substrate P is moved with respect to the optical path space K1 at 600 mm/sec.

In this way, by increasing the movement velocity of the substrate P, it is possible to restrict rises in the concentration of the eluted substance in the liquid LQ in the vicinity of the lower surface LSA of the first optical element LS1, that is, the concentration $Dn_L$ of the low concentration area $A_L$. In addition, since the concentration $Dn_L$ of the low concentration area $A_L$ changes according to the movement velocity of the substrate P, the allowable concentration Dnr for satisfying the condition of Equation (2) above can be optimally set by, for example, experimentation or simulation while taking into account the movement velocity of the substrate P. For example, in the case where the movement velocity of the substrate P has been increased, even if the amount of eluted substance eluted into the liquid LQ from the substrate P becomes large so that the value of the concentration $Dn_H$ of die high concentration area $A_H$ becomes large and the value of the average concentration Dn (allowable concentration Dnr) becomes large in conjunction with this, it is possible to restrict the concentration of the eluted substance in the liquid LQ in the vicinity of the lower surface LSA of the first optical element LS1, so it is possible to set the allowable concentration Dnr to a relatively high value within a range that satisfies the condition of Equation (2). In addition, there is a possibility that the transmittance $R_G'$ of the first optical element LS1 will change according to the characteristics (physical properties, type) of the eluted substance, so it is possible to optimally set die allowable concentration Dnr according to information relating to the photosensitive material 2.

Fourth Embodiment of the Exposure Method

Figure 6A:
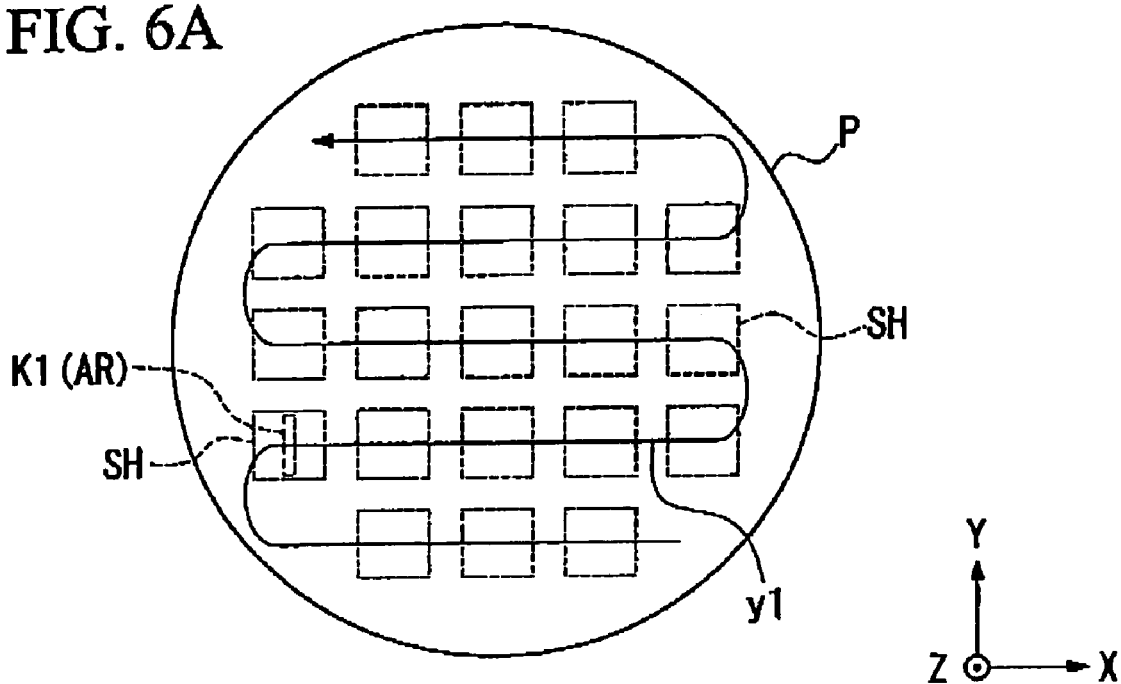
FIG. 6A is a drawing mat shows an example of the movement track of the optical path space and the substrate.
Figure 6B:
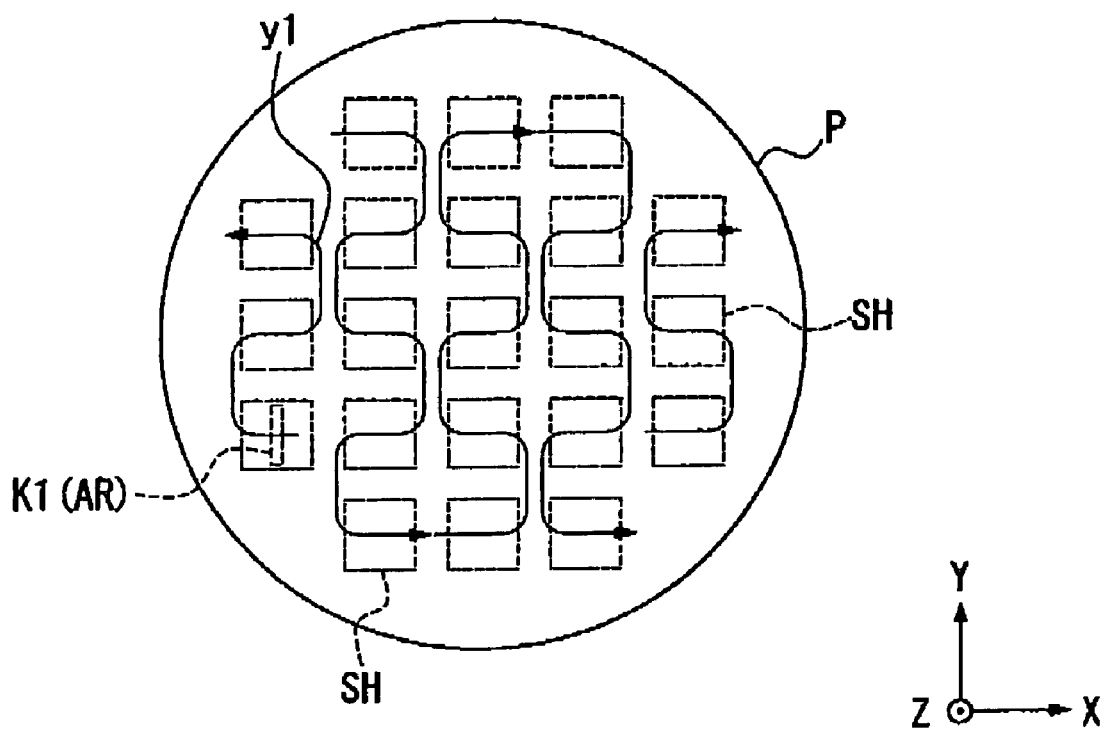
FIG. 6B is a drawing that shows an example of the movement track of the optical path space and the substrate.

In addition, there is a possibility that the concentration $Dn_L$ of the eluted substance in the liquid LQ of the low concentration area $A_L$ and, in turn, the ratio R of the average concentration Dn and the concentration $Dn_L$ of the low concentration area $A_L$ will fluctuate according to the structure (shape) of the nozzle member 70, the amount of supply and the amount of recovery of the liquid per unit time by the liquid immersion mechanism 100 with respect to the optical path space K1, or the movement conditions (including the movement velocity, movement track, etc.) of the substrate P. For example, the concentration $Dn_L$ of the low concentration area $A_L$ (ratio R) fluctuates according to the movement distance of the substrate P with respect to the optical path space K1 relating to a prescribed direction (X axis direction). Specifically, as shown in FIG. 6A, a long movement distance of the substrate P with respect to the optical path space K1 relating to the prescribed direction (X axis direction) has more restriction of agitation of the liquid LQ that is being filled into the optical path space K1 than when the movement distance of the substrate P is short as shown in FIG. 6B, so it will be possible to restrict movement of the liquid LQ from the high concentration area $A_H$ to the low concentration area $A_L$ to make the concentration $Dn_L$ of the low concentration area $A_L$ (ratio R) smaller. Here, the arrow y1 of FIG. 6A and FIG. 6B shows the movement track when the substrate P and the optical path space K1 (projection area AR of the projection optical system PL, optical axis) have been relatively moved, and the area SH that has been set on the substrate P indicates the shot area into which pattern of the mask M is transferred. In addition, there is a possibility that it will be possible to cause the ratio R (=$Dn_L$/Dn) to fluctuate from 1/10 to 1/1000 by appropriately adjusting the structure of the nozzle member 70, the supply amount and recovery amount of the liquid per unit time to the optical path space K1, and the movement conditions (including the movement velocity, movement track, etc) of the substrate P.

Figure 7:
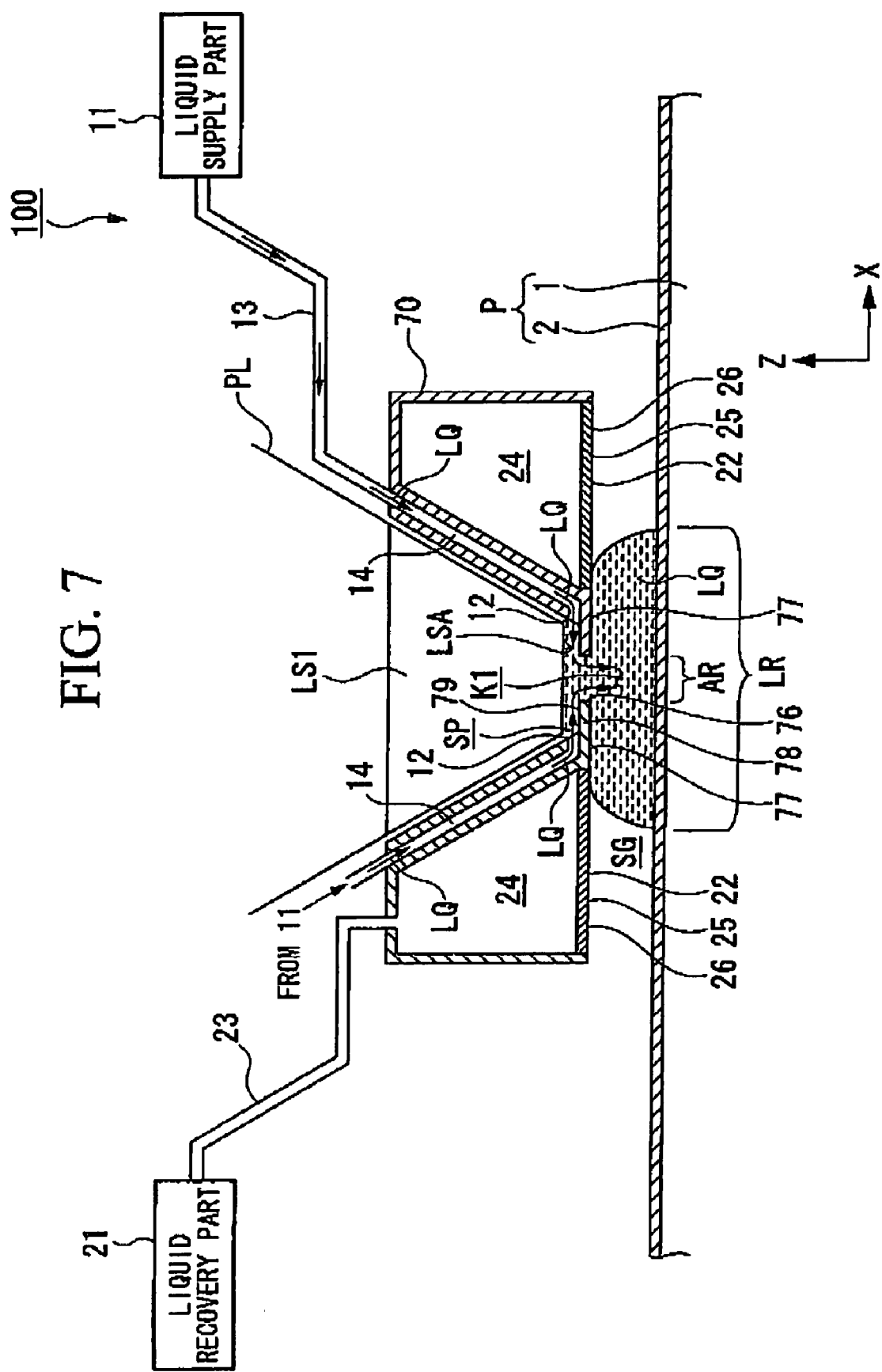
FIG. 7 is a cross sectional view mat shows an embodiment of a nozzle member.

In addition, for example, in the case of a nozzle member 70 that has a structure shown in FIG. 7, it is possible to reduce the ratio R (=$Dn_L$/Dn). La FIG. 7, the nozzle member 70 has supply ports 12, which supply the liquid LQ to the optical path space K1, and a recovery port 22, which recovers the liquid LQ. Supply flow paths 14, which connect the supply ports 12 and the supply pipes 13, and the recovery flow path 24, which connects the recovery port 22 and the recovery pipe 23, are formed at the interior of the nozzle member 70. The supply flow paths 14 are formed by slit-shaped through holes that pass through a portion of the nozzle member 70. The recovery flow path 24 is provided outside the supply flow paths 14 with respect to the optical path space K1.

The nozzle member 70 has a bottom plate 78, which has an upper surface 79 that opposes the lower surface LSA of the first optical element LS1. A portion of the bottom plate 78 is, in relation to the Z axis direction, arranged between the lower surface LSA of the first optical element LS1 of the projection optical system PL and the substrate P (substrate stage PST). In addition, an opening 76 through which the exposure light EL passes is formed at die center part of the bottom plate 78. The opening 76 is formed to be larger than the projection area AR to which the exposure light EL is irradiated. In the present embodiment, die opening 76 is formed in a rectangular shape in a planar view to correspond to the cross-sectional shape of the exposure light EL (specifically, the projection area AR).

A lower surface 77, which opposes the surface of the substrate P held by the substrate stage PST, of the bottom plate 78 of the nozzle member 70 is a flat surface that is parallel to the XY plane. The lower surface 77 is provided at a position of the nozzle member 70 that is nearest the substrate P held by the substrate stage PST. The liquid LQ is held between the lower surface 77 of the bottom plate 78 and the surface of the substrate P.

The bottom plate 78 is provided so that it does not come into contact with the lower surface LSA of the first optical element LS1 and the substrate P (substrate stage PST), and a space that has a prescribed gap is provided between the lower surface LSA of the first optical element LS1 and the upper surface 79 of the bottom plate 78. In the following explanation, the space of the inner side of the nozzle member 70, which includes die space between the lower surface LSA of the first optical element LS1 and the upper surface 79 of the bottom plate 78, is referred to as the internal space SP as appropriate.

The supply ports 12 are provided at positions that connect to the internal space SP. In the present embodiment, the supply ports 12 are provided at the respective prescribed positions of both sides of the X axis direction flanking the optical path space K1 at the outer side of the optical path space K1 of the exposure light EL. The supply pipes 13 and die supply flow paths 14 are plurally provided so as to correspond to the plurality (two) of supply ports 12. In addition, though not shown in the drawing, the nozzle member 70 comprises a discharge port that discharges (exhausts) gas of the internal space SP to an external space (atmospheric space). The discharge port is connected with the gas of the internal space SP, specifically, the gas of the vicinity of the image plane of the projection optical system PL, and the gas of the internal space SP is such that it can be discharged (exhausted) to the external space via the discharge port.

The recovery port 22 is provided above the substrate P held by the substrate stage PST at a position that opposes the surface of that substrate P. The recovery port 22 comprises a porous member 25 that has a plurality of holes. The porous member 25 may be configured by a mesh member made of titanium for example or a porous body made of ceramics. The porous member 25 has a lower surface 26 that opposes the substrate P held by the substrate stage PST. The lower surface 26 of the porous member 25, which opposes the substrate P, is nearly flat. The porous member 25 is provided on the recovery port 22 so that the lower surface 26 thereof becomes nearly parallel with the surface (specifically, the XY plane) of the substrate P held by the substrate stage PST. The liquid LQ is recovered via the porous member 25 arranged on the recovery port 22. In addition, the lower surface 77 of the bottom plate 78 and the lower surface 26 of the porous member 25 are provided to be nearly flush.

In order to fill the optical path space K1 of the exposure light EL with the liquid LQ, the control apparatus CONT respectively drives the liquid supply part 11 and the liquid recovery part 21. After the liquid LQ delivered from the liquid supply part 11 has passed through the liquid supply pipes 13, it is supplied to the internal space SP from the liquid supply ports 12 via the supply flow paths 14 of the nozzle member 70. After the liquid LQ that has been supplied to the internal space SP from the supply ports 12 has filled the internal space SP, it flows into a space SG between the nozzle member 70 (lower surface 77) and the substrate P (substrate stage PST) via the opening 76 and fills the optical path space K1 of the exposure light EL. In this way, in the present embodiment, the liquid LQ is supplied to the internal space SP between the first optical element LS1 and the bottom plate 78 from the supply ports 12. The liquid LQ that has been supplied to the internal space SP from the supply ports 12 flows toward the opening 76 and flows into the space SG. In addition, the liquid recovery part 21, which includes a vacuum system, is able to recover the liquid LQ that is present in the space SG between the nozzle member 70 (recovery port 22) and the substrate P via the recovery port 22 by bringing the recovery flow path 24 to a negative pressure. After the liquid LQ that is being filled into the optical path space K1 of the exposure light EL has flowed into the recovery flow path 24 via the recovery port 22 of the nozzle member 70 and has flowed through the recovery pipe 23, it is recovered by the liquid recovery part 21.

In the vicinity of the lower surface LSA of the first optical element LS1, specifically, in the internal space SP, a flow of the liquid LQ from the supply ports 12 toward the opening 76 is generated. In addition, the liquid LQ, which includes the eluted substance eluted from the substrate P, is restricted from coming into contact with the lower surface LSA of the first optical element LS1 by means of the bottom plate 78 arranged between die first optical element LS1 and the substrate P. In addition, the clean liquid LQ from the supply ports 12 is supplied into the internal space SP, and the amount of the liquid LQ that has flowed from the space SG between the nozzle member 70 and the substrate P toward the internal space SP is small, so it is possible to set the concentration $Dn_L$ of the eluted substance in die liquid LQ in the vicinity of the lower surface LSA of the first optical element LS1 (internal space SP) to a: value that is considerably smaller than the average concentration Dn. In addition, it is also possible to restrict rises in the concentration of the eluted substance in the liquid LQ of the optical path space K1 by means of the flow of the liquid LQ.

In addition, in a nozzle member 70 that has a structure such as that shown in FIG. 7, it was found that the concentration $Dn_L$ of die internal space SP, specifically, the concentration $Dn_L$ of the low concentration area $A_L$, becomes approximately 1/80 (R=1/80) the average concentration Dn and that it is possible to restrict clouding of the first optical element LS1 by setting the amount (allowable amount) of the PAG eluted into the liquid LQ from the substrate P by coming into contact with the liquid LQ to 2.5 ng/cm² or less.

In addition, in the case in which exposure is performed while moving the substrate P in the XY direction with respect to the projection area LR, his possible to set the amount (allowable amount) of the PAG eluted into the liquid LQ from the substrate P by coming into contact with the liquid LQ to 2.5 ng/cm²/s or less in the case where the time that the respective areas of a local portion on the substrate P come into contact with the liquid LQ is approximately one second.

Fifth Embodiment of the Exposure Method

In the first and second embodiments discussed above, a case was explained in which the concentration Dn of the eluted substance per 1 mm of liquid was controlled (set) so that the transmittance $R_P$ per 1 mm of that liquid satisfies the conditions of Equations (1) and (1') above. However, in the case in which the optical path space K1 has been filled with a prescribed medium, the transmittance, which is the ratio of the amount of light of the exposure light EL when it has emerged from the lower surface LSA of the projection optical system PL and the amount of light of the exposure light EL when it has reached onto the substrate P, changes according to the thickness of the medium through which the exposure light EL passes at the working distance WD, specifically, the optical path space K1. For this reason, it is possible to set the concentration Dn of the eluted substance in the solution according to the working distance WD. This will be explained while referring to FIG. 8A and FIG. 8B.

Figure 8A:
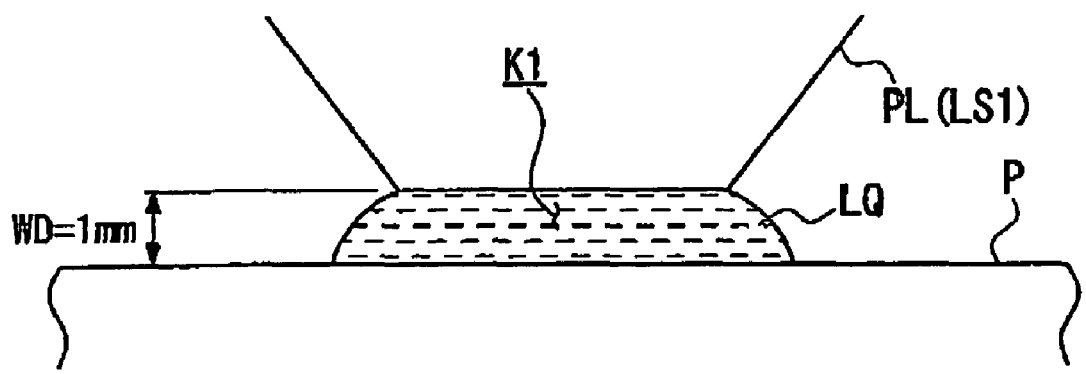
FIG. 8A is a drawing for explaining the relationship between the transmittance and the distance in the optical path direction of the exposure light in the optical path space.
Figure 8B:
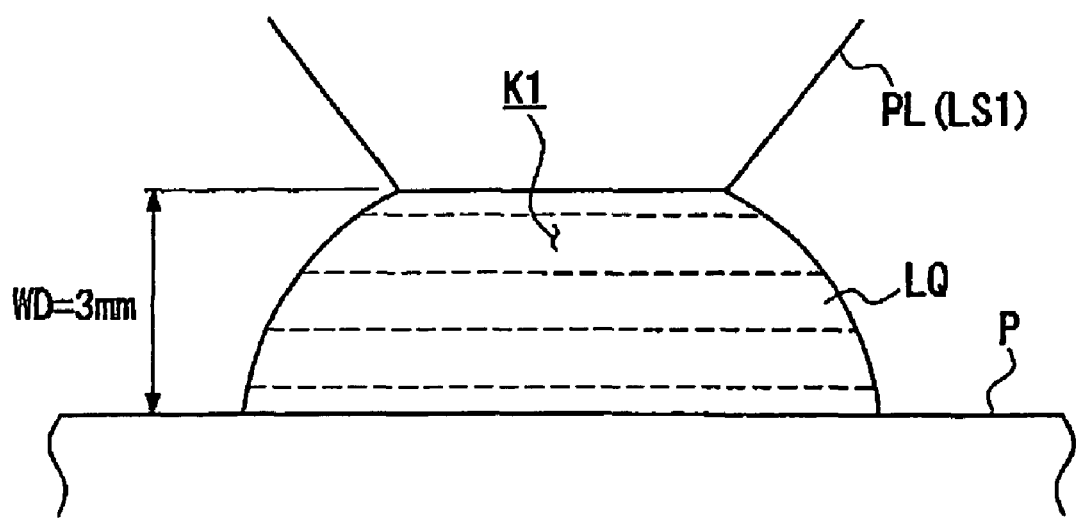
FIG. 8B is a drawing for explaining the relationship between the transmittance and the distance in the optical path direction of the exposure light in the optical path space.

FIG. 8A is a drawing that shows the condition in which the working distance WD is set to 1 mm, and FIG. 8B is a drawing that shows the condition in which the working distance WD is set to 3 mm. In FIG. 8A and FIG. 8B respectively, the liquid LQ is filled into the optical path space K1 between the projection optical system PL and the substrate P.

The liquid LQ that is filled into the optical path space K1 is a pure solution, and when the transmittance $R_W$ per 1 mm of pure solution is 99% as in the embodiment discussed above, in the case where the working distance WD (thickness of the pure solution) is 1 mm, the transmittance $R_W$, which is the ratio of the amount of light $I_0$ of the exposure light EL when it was incident to the pure solution of the optical path space K1 and the amount of light $I_W$ of the exposure light EL when it was incident from the pure solution of the optical path space K1, is 99%. On the other hand, in the case where the working distance WD (thickness of the pure solution) is 3 mm, the transmittance $R_W$, which is the ratio of the amount of light $I_0$ of the exposure light EL when it was incident to the pure solution of die optical path space K1 and the amount of tight $I_W$ of the exposure light EL when it was incident from the pure solution of the optical path space K1, is 97%. In this way, the transmittance $R_W$ changes according to the thickness (distance in die optical path direction of die exposure light EL) of the medium (pure solution). Therefore, in order to obtain the desired amount of light (target amount of light) $I_r$ on die substrate P, it is necessary to control (set) the concentration Dn of the eluted substance in the liquid LQ according to the working distance WD (thickness of the liquid LQ). Specifically, when the pure solution has been used as the liquid LQ that is filled into the optical path space K1, in the case in which the working distance is 3 mm, the amount of light $I_W$ on the substrate P is 97% with respect to the amount of light $I_0$ when it is incident to the pure solution of the optical path space K1, so it is necessary to restrict reductions in transmittance attributable to the eluted substance such as PAG as much as possible in order to obtain the desired amount of light (target amount of light) $I_r$ on the substrate P. Specifically, it is necessary to restrict as much as possible the concentration Dn of the eluted substance in the liquid LQ dot has been filled into the optical path space K1 with a working distance WD of 3 mm. On the other hand, in the case in which die working distance WD is 1 mm, the amount of light $I_W$ on the substrate P is 99% with respect to the amount of light $I_0$ when it was incident to the pure solution of the optical path space K1, so even if the amount of reduction in transmittance attributable to the eluted substance such as PAG were large to a certain extent, it would be possible to obtain the desired amount of light (target amount of light) $I_r$ on the substrate P. Specifically it is allowable for the concentration Dn of the eluted substance in the liquid LQ that has been filled into the optical path space K1 with a working distance WD of 1 mm to be a high value to a certain extent.

Therefore, when the transmittance of the liquid (solution) LQ arranged in the optical path space K1 in the optical axis direction of the exposure light EL is $R_P (=I_P/I_0)$, and the target transmittance determined in advance is $R_r (=I_r/I_0)$, the concentration Dn (allowable concentration Dnr) of the eluted substance in the liquid LQ when the eluted substance has been eluted into the liquid LQ from the substrate P is set so as to satisfy the following condition $$R_P \geq R_r \quad (2').$$

Doing this makes it possible to cause the exposure light EL to reach onto the substrate P at a prescribed amount of light $I_r$.

In this way, it is possible to set the concentration Dn of the eluted substance in the liquid LQ and, in turn, the amount of elution of the eluted substance from the substrate P to the liquid LQ according to the working distance WD (thickness of the liquid LQ). Therefore, by optimally setting the concentration Dn of the eluted substance in the liquid LQ, the liquid LQ that has been filled into the optical path space K1 is able to maintain the desired transmittance $R_P$ even if die working distance WD changes due to the model of the exposure apparatus or the process conditions.

The allowable concentration Dnr for satisfying the condition of Equation (2') above can be obtained by, for example, experimentation or simulation. It is possible to satisfy the condition of Equation (2') above by restricting the concentration Dn of the eluted substance in the liquid (solution) LQ to the allowable concentration Dnr or less. Therefore, in the same way as in the embodiments discussed above, since there is a possibility that the transmittance $R_P$ of the solution will change it according to the characteristics of the substrate P (photosensitive material 2), it is possible to optimally set the allowable concentration Dnr according to information relating to the substrate P.

In addition, as discussed above, it is possible to set the concentration Dn so as to satisfy the condition of Equation (2') above by performing the prescribed processing, such as the liquid immersion treatment, on the substrate P.

The concentration Dn (allowable concentration Dnr) in the fifth embodiment refers to the average concentration along the Z axis direction (optical axis direction of the exposure light EL) in the liquid LQ that has been filled into the optical path space K1 between the projection optical system PL and the substrate P. This does not mean that the eluted substance that has been eluted from the substrate P uniformly diffuses into the liquid LQ instantly, and a high concentration area is formed in the vicinity of the surface of the substrate P. Specifically, even in a status in which a high concentration area of the eluted substance is formed in the vicinity of the surface of the substrate P, there are cases in which die concentration of the eluted substance in the vicinity of the lower surface LSA of the projection optical system PL is low. In such case as well, if the average concentration in the Z axis direction (optical axis direction of the exposure light EL) in the liquid LQ is the allowable concentration Dnr or less, it is possible to cause die exposure light EL to reach onto the substrate P at the desired amount) of light $I_r$.

Application Example 1

An example of an experiment performed to obtain the allowable concentration of the eluted substance in the liquid LQ will be explained below. In the present application example, the case in which the allowable concentration and the allowable elution amount of the PAG in the liquid LQ are obtained so as to satisfy prescribed specifications (target conditions) determined in advance will be explained as an example. In addition, in the case in which the thickness (working distance WD) of the liquid LQ in the optical path space K1 between the projection optical system PL and the substrate P has been set to 3 mm, the specification (target condition) is the fact that the ratio of the amount of light $I_W$ of the exposure light EL that has come via the pure solution and the amount of light $I_P$ of the exposure light EL that has come via the solution is set to 99.9% or higher ($I_P/I_W \geq 99.9\%$).

Figure 9:
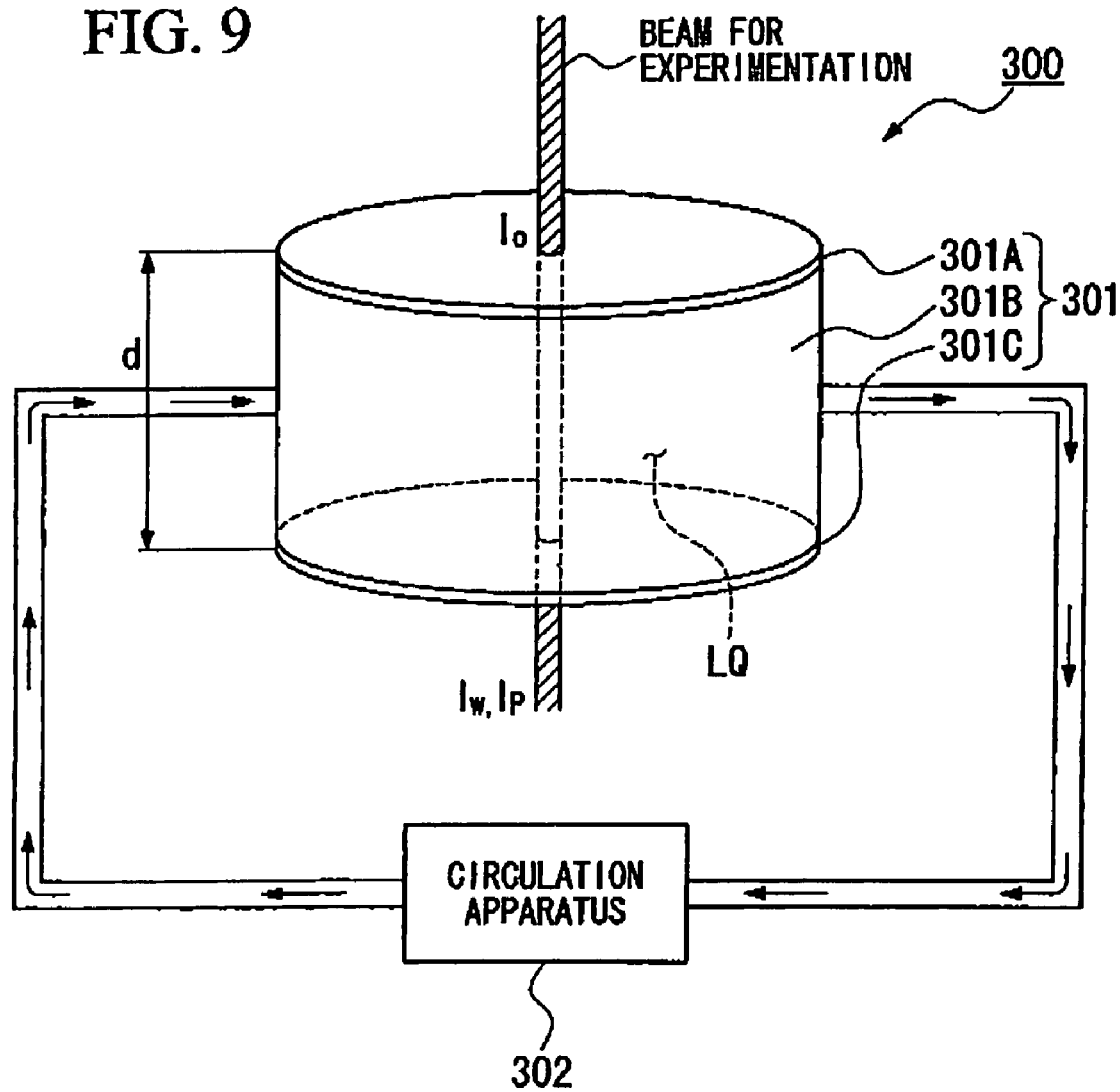
FIG. 9 is a schematic block diagram that shows an example of an experimentation apparatus.

FIG. 9 is a drawing that shows an example of an experimentation apparatus 300 used in experiments. In FIG. 9, the experimentation apparatus 300 comprises a container 301, into which the liquid LQ subject to experimentation is filled, and a circulation apparatus 302, which circulates the liquid LQ using a circulation system that includes the container 301. The container 301 comprises a cylindrical member 301B, an upper plate 301A, which is connected to the upper end part of that cylindrical member 301B, and a lower plate 301C, which is connected to the lower end part. The upper plate 301A and the lower plate 301C are respectively formed of the same material (here, quartz) as the first optical element LS1 of the exposure apparatus EX, and they are able to transmit ArF excimer laser light. The distance d between the lower surface of the upper plate 301A and the upper surface of the lower plate 301C, which opposes the lower surface of that upper plate 301A, can be set as desired.

In the experiment, in a status in which the distance (thickness of the liquid LQ) "d" between the lower surface of the upper plate 301A and the upper surface of the lower plate 301C of the container 301 is set to a prescribed value, and the liquid (pure solution, solution) LQ has been filled into that container 301, a beam for experimentation of an amount of light $I_0$ is incident to die liquid LQ via the upper plate 301A, and the amount of light ($I_W$, $I_P$) of the beam for experimentation that has passed through the liquid LQ is measured. Specifically, the beam for experimentation is irradiated in a status in which the pure solution has been filled into the container 301, and the amount of light $I_W$ of the beam for experimentation that has passed through the pure solution is measured while the beam for experimentation is irradiated in a status in which the solution has been filled into the container 301, and the amount of light $I_P$ of the beam for experimentation that has passed through the solution is measured.

The beam for experimentation is ArF excimer laser light, which is the same as the exposure light EL. When the beam for experimentation is irradiated, the circulation apparatus 302 is used to circulate the liquid LQ using a circulation system that includes the container 301. The circulation apparatus 302 comprises a function that performs temperature regulation of the liquid LQ to be circulated. By irradiating the beam for experimentation to die liquid LQ via the upper plate 301A while circulating while temperature adjusting the liquid LQ using the circulation system that includes the container 301, it is possible to restrict temperature rises (temperature changes) of the liquid LQ resulting from irradiation of the beam for experimentation. Note that, in the present application example, the diameter of the light beam of the beam for experimentation is 8 mm, and the diameter of the upper plate and the lower plate is approximately 30 mm.

The solution that is subject to experimentation is a PAG aqueous solution, and the PAG in die solution is set in advance to a prescribed concentration. In addition, the PAG has prescribed characteristics (physical properties), and, in the present experiment, PAG with a molecular weight of 565 is used. In addition to the molecular weight, the light absorption coefficient "a" can also be given as a physical property value peculiar to the PAG. The relationship $$I_P/I_W = \exp(-acd) \quad (3)$$

is established between amounts of light $I_W$ and $I_P$ and the light absorption coefficient "a".

Here,

"a": light absorption coefficient,

"c": concentration of the eluted substance (PAG) in the liquid, and

"d": thickness of the liquid (medium).

The distance (thickness of the liquid) "d" between the lower surface of the upper plate 301A and the upper surface of the lower plate 301C in the experimentation apparatus 300 corresponds to the working distance WD between the projection optical system PL of the exposure apparatus EX and the substrate P. By appropriately setting the concentration V and the thickness "d" of the medium (for example, thickness "d"=1 mm) concentration "c"= 1%) as the experimental conditions and measuring amounts of light $I_0$ and $I_P$ under those experimental conditions, it is possible to calculate the light absorption coefficient "a" based on amount of light hr obtained in advance and Equation (3) above. In the present application example, a result of light absorption coefficient "a"≈0.012787 was obtained.

After the tight absorption coefficient "a" (≈0.012787) obtained in tins way is substituted into Equation (3), it is possible to obtain the concentration (allowable concentration) "c" of the PAG for satisfying the specifications discussed above by interpreting by applying the values ("d"=3 mm, $I_P/I_W$=99.9%), which are the specifications discussed above, to Equation (3). In the present application example, the concentration (allowable concentration) of the PAG in the liquid LQ for satisfying specifications discussed above is approximately 25 ppb ($25 \times 10^{-6}$%). Specifically, if the working distance WD in the exposure apparatus EX is set to 3 mm, and PAG that has the prescribed physical properties discussed above is used, by setting the concentration of the PAG in the liquid LQ that has been filled into the optical path space K1 to 25 ppb or less, it is possible to satisfy the specifications discussed above. In addition, by filling the liquid LQ that has been set to this concentration (25 ppb) into the optical path space K1 of the exposure apparatus EX, in a case where the working distance WD is 3 mm, it is possible to set the ratio $(I_P/I_W)$ of amount of light $I_W$ and the amount of light $I_P$ to 99.9% or higher.

Next, when liquid immersion exposure of the substrate P is performed using the exposure apparatus EX explained while referring to FIG. 1, the allowable amount of elution per unit area of the PAG eluted from the substrate P for satisfying the above specifications is obtained. The amount of supply of liquid supplied from the supply ports 12 of the nozzle member 70 per unit time is set to 0.5 liters/minute, and the time during which liquid immersion of one substrate P is performed is set to 20 seconds (specifically, throughput 180 units/hour=3 units/minute). When tins is done, the amount of the liquid LQ used when liquid immersion exposure treatment is performed on one substrate P is approximately 160 g (0.5 liters/3 units). Therefore, in order to satisfy the above specifications, the total weight of PAG allowed becomes $4.0 \times 10^{-6}$ g (160 g×25 ppb) even if eluted into the liquid LQ from the substrate P during liquid immersion exposure treatment of one substrate P. Specifically, the (total weight of PAG that it is allowable to elute from the photosensitive material 2 during the exposure processing time (20 seconds) for one substrate P is $4.0 \times 10^{-6}$ g.

In the case where the substrate P is of a cylindrical shape with a diameter of 300 mm, die area of the substrate P becomes approximately 706 cm², so the allowable amount of elution of die PAG per unit area of the substrate P is approximately $5.7 \times 10^{-9}$ g/cm² ($4.0 \times 10^{-6}$ g/706 cm²). The molecular weight of the PAG is 565, so it is approximately $1.0 \times 10^{-11}$ mol/cm² ($5.7 \times 10^{-9}$ g/cm²/565). Specifically, the allowable amount of elution of the PAG per unit area of the substrate P is $1.0 \times 10^{-11}$ mol/cm².

Note that, in die case where the thickness (working distance WD) of the liquid LQ=1 mm, if the specifications are $I_P/I_W \geq 99.9\%$, as explained in the fifth embodiment of the exposure method discussed above, the concentration of the PAG in the liquid LQ may be made heavy, and the concentration (allowable concentration) of the PAG in the liquid LQ in that case becomes approximately 75 ppb (25 ppb×3). Similarly, in the case where the thickness (working distance WD) of the liquid LQ has been set to 1 mm, the allowable amount of elution of the PAG per unit area of the substrate P may be made large, and it may be approximately $3.0 \times 10^{-11}$ mol/cm².

Note that, as discussed above, there is a possibility that amine group substances, etc. will also be eluted from the substrate P (photosensitive material 2) in addition to the PAG, so the concentration of the amine group substance should be set by the same procedure as the above. For example, if the molecular weight, which is a physical property value peculiar to the amine group substance, is 521, and, as a result of having performed an experiment similar to the experiment discussed above; light absorption coefficient "a"=0.007098392 is computed, the concentration of that amine group substance should be set to approximately 135 ppb or less under the condition of working distance WD=3 mm.

On the other hand, it is conceivable that there will be relatively little amine group substance, as the eluted substance eluted into the liquid LQ from the substrate P, compared to the PAG, and a reduction in the transmittance of the liquid LQ will be mainly attributable to the PAG. Therefore, by mainly controlling (setting) the concentration of the PAG in the liquid LQ, it is possible to preferably restrict reductions in transmittance attributable to the eluted substance eluted into the liquid LQ from the substrate P as well as temperature rises of the liquid LQ accompanying those reductions in transmittance.

Application Example 2

In the present application example, in the case in which the thickness (working distance WD) of the liquid LQ in the optical path space K1 between the projection optical system PL and the substrate P has been set to 5 mm, a specification (target condition) is the fact that the ratio of the amount of light $I_W$ of the exposure light EL that has come via the pure solution and the amount of light $I_P$ of the exposure light EL that has come via the solution is set to 99% or higher ($I_P/I_W \geq 99\%$). The experimentation apparatus 300 explained while referring to FIG. 9 is used in the experiment, and the experimental conditions are also nearly equivalent to those of Application Example 1.

The molecular weight of the PAG used in the present application example is 565, which is the same as Application Example 1. In addition, the light absorption coefficient of the PAG is "a"≈0.012787. In the same way as in Application Example 1, after the light absorption coefficient "a" is substituted into Equation (3), it is possible to obtain the concentration (allowable concentration) "c" of the PAG (so as to satisfy the specifications discussed above by interpreting by applying those values ("d"=5 mm, $I_P/I_W$=99%), which are the specifications discussed above, to Equation (3). In die present application example, the concentration (allowable concentration) of the PAG in the liquid for satisfying the specifications discussed above is approximately 157 ppb ($15.7 \times 10^{-6}$%). Specifically, if the working distance WD in the exposure apparatus EX is set to 5 mm, and PAG that has the prescribed physical properties discussed above is used, by setting the concentration of PAG in the liquid LQ that has been filled into the optical path space K1 to 157 ppb or less, it is possible to satisfy the specifications discussed above. In addition, by filling the liquid LQ that has been set to this concentration (157 ppb) into the optical path space K1 of the exposure apparatus EX, in a case where the working distance WD is 5 mm, it is possible to set the ratio $(I_P/I_W)$ of amount of light $I_W$ and amount of light $I_P$ to 99% or higher.

Next, when liquid immersion exposure of the substrate P is performed using the exposure apparatus EX explained while referring to FIG. 1, the allowable amount of elution per unit area of the PAG eluted from the substrate P for satisfying the above specifications is obtained. The amount of) supply of the liquid supplied from the supply ports 12 of the nozzle member 70 per unit time is set to 0.5 titers/minute, and the time during which liquid immersion of one substrate P is performed is set to 20 seconds (specifically, throughput 180 units/hour=3 units/minute). When this is done, the amount of the liquid LQ used when liquid immersion exposure treatment is performed on one substrate P is approximately 160 g (0.5 liters/3 units). Therefore, in order to satisfy the above specifications, the total weight of PAG allowed becomes $25.0 \times 10^{-6}$ g (160 g×157 ppb) even if eluted into the liquid LQ from the substrate P during liquid immersion exposure treatment of one substrate P. Specifically, the total weight of PAG that it is allowable to elute from the photosensitive material 2 during the exposure processing time (20 seconds) for one substrate P is $25.0 \times 10^{-6}$ g.

In the case where the substrate P is of a cylindrical shape with a diameter of 300 mm, the area of the substrate P becomes approximately 706 cm², so the allowable amount of elution of the PAG per unit area of the substrate P is approximately $35.0 \times 10^{-9}$ g/cm² ($25 \times 10^{-6}$ g/706 cm²). The molecular weight of the PAG is 565, so it is approximately $6.0 \times 10^{-11}$ mol/cm² ($35.0 \times 10^{-9}$ g/cm²/565). Specifically the allowable amount of elution of the PAG per unit area of the substrate P is $6.0 \times 10^{-11}$ mol/cm².

Application Example 3

In the case in which an eluted substance is included in the liquid LQ, as discussed above, there is a possibility that the first optical element LS1 that comes into contact with the liquid LQ will become contaminated (clouded), and there is a possibility that the degree of that clouding will become large over time due to irradiation of the exposure light EL. When the first optical element LS1 becomes clouded, there is concern that the energy of the irradiated exposure light EL will be absorbed and that this will cause thermal deformation, etc. Therefore, it is necessary to restrict the occurrence of clouding as much as possible. The amount of reduction in the transmittance of the exposure light EL attributable to clouding (contamination) of the first optical element LS1 (degree of clouding of the first optical element LS1) changes according to the concentration of the eluted substance in the liquid LQ. Therefore, the concentration of the eluted substance in the liquid LQ may be set so that the amount of reduction in the transmittance attributable to clouding of the first optical element LS1 satisfies specifications that have been determined in advance.

An example of an experiment performed in order to obtain the allowable concentration to satisfy the specification (target condition) relating to clouding will be explained below. In the present application example, the case in which the allowable concentration and the allowable amount of elation of the PAG in the liquid LQ is obtained so as to satisfy specifications that have been determined in advance will be explained as an example. In addition, when the amount of light of the exposure light EL at a first point in time is $I_P$, and the amount of light at a second point in time after a prescribed time has elapsed from the first point in time (here, one year after) is $I_P'$, setting the ratio ($I_P'/I_P$) of amount of light $I_P$ and amount of light $I_P'$ to 99.9% or more is considered a specification (target condition).

The experiment is performed using the experimentation apparatus 300 that was explained using FIG. 9, the distance (thickness of the liquid) "d" between the lower surface of the upper plate 301A and the upper surface of the lower plate 301C of the container 301 was set to a prescribed value, an aqueous solution of the PAG that has been set to the prescribed concentration (here, 400 ppm) was circulated while performing temperature adjustment using a circulation system that includes the container 301 while the beam for experimentation was irradiated to the liquid LQ via the upper plate 301A. The beam for experimentation was irradiated for thirty minutes. When ArF excimer laser light (beam for experimentation) was irradiated to a solution that contains PAG, clouding occurred on the upper plate 301A due to a photochemical reaction.

In the experiment, the amount of light $I_P$ of the beam for illumination after it is passed through the liquid LQ was measured in a status in which clouding was not occurring on the upper plate 301A while the amount of light $I_P'$ of the beam for illumination after it is passed through the liquid LQ was measured in a status in which clouding was occurring on the upper plate 301A thirty minutes after the start of irradiation of the exposure light EL. The ratio of the amount of light $I_P$ before clouding occurs on the upper plate 301A and the amount of light $I_P'$ after clouding has occurred was 75.2% ($I_P'/I_P$=75.2%).

The relationship $$I_P'/I_P = \exp(-acd) \quad (4)$$

is established among the light absorption coefficient "a", the concentration "c" of PAG in the liquid, and the thickness "d" of the liquid. When the experimental results discussed above are expressed using Equation (4), $$0.752 = \exp(-acd) \quad (5)$$

results. When Equation (5) is transformed, $$acd = -\log(0.752) \quad (6)$$

results.

On the other hand, the specification discussed above is the fact that the ratio of amount of light $I_P$ and amount of light $I_P'$ is 99.9% or higher ($I_P'/I_P \geq 99.9\%$). Therefore, when the specification is expressed using Equation (4), $$0.999 = \exp(-acd) \quad (7)$$

results. When Equation (7) is transformed, $$acd = -\log(0.999) \quad (8)$$

results.

In Equation (6) and Equation (8), the light absorption coefficient "a" and the thickness "d" of the liquid are respectively the same value. On the other hand, the concentration "c" of Equation (6), which is the experimental result, has a value that is different from the concentration "c" of Equation (8) for satisfying the above specifications. Through Equations (6) and (8), $$\log(0.999)/-\log(0.752) \approx (0.752) \approx 1/285 \quad (9)$$

results. Therefore, by reducing the concentration "c" of Equation (6) to 1/285, it is possible to satisfy the specifications discussed above. Specifically, in order for the amount of reduction of the transmittance (the ratio of amount of light $I_P$ and amount of light $I_P'$) in the experiment to satisfy the above specifications, it is necessary for the concentration "c" to be 1.4 ppm (400 ppm/285) or less.

Here, as discussed above, in the experiment, the beam for experimentation is irradiated for thirty minutes, but the ArF excimer laser apparatus, which emits the beam for experimentation, emits the beam for experimentation by means of pulse oscillation, and the number of pulses thereof is $1.4 \times 10^6$ in thirty minutes. On the other hand, the light source (ArF excimer laser apparatus) of the exposure light EL of the exposure apparatus EX is also one that emits the exposure light EL by pulse oscillation, and in the case where the number of pulses thereof is $1.0 \times 10^{10}$ in one year, the ratio of the number of pulses between the experimentation apparatus 300 and the exposure apparatus EX is 7000 ($1.0 \times 10^{10}/1.4 \times 10^6$). Therefore, in the exposure apparatus EX, by reducing the concentration of PAG in the liquid LQ that is filled into the optical path space K1 to approximately 0.2 ppb (1.4 ppm/7000), it is possible to satisfy the above specifications. By filling the liquid LQ that has been set to this concentration (0.2 ppb) into the optical path space K1 of the exposure apparatus EX, it is possible to restrict clouding of the first optical element LS1, and it is possible to set the ratio of the amount of light (amount of light at first point in time) Ip' before clouding occurs in the first optical element LS1 and the amount of light (amount of light at a second point in time) $I_P$ after clouding has occurred to 99.9% or higher ($I_P'/I_P \geq 99.9\%$).

Next, when liquid immersion exposure of the substrate P is performed using the exposure apparatus EX explained while referring to FIG. 1, the allowable elution amount per unit area of the PAG eluted from the substrate P for satisfying the above specifications is obtained. The supply amount per unit time of the liquid Supplied from the liquid supply ports 12 of the nozzle member 70 is set to 0.5 liters/minute, and the time during which liquid immersion exposure of one substrate P is performed is set to 20 seconds (specifically, throughput 180 units/hour=3 units/minute). When this is done, the amount of the liquid LQ used when liquid immersion exposure treatment is performed on one substrate P is approximately 160 g (0.5 liters/3 units). Therefore, in order to satisfy the above specifications, the total weight of PAG allowed becomes $32.0 \times 10^{-9}$ g (160 g×0.2 ppb) even if eluted into the liquid LQ from the substrate P during liquid immersion exposure treatment of one substrate P. Specifically, the total weight of PAG that it is allowable to elute from the photosensitive material 2 during the exposure processing time (20 seconds) for one substrate P is $32 \times 10^{-9}$ g.

In the case where the substrate P is of a cylindrical shape with a diameter of 300 mm, the area of the substrate P becomes approximately 706 cm², so the allowable amount of elution of the PAG per unit area of the substrate P is approximately $45 \times 10^{-12}$ g/cm² ($32 \times 10^{-9}$ g/706 cm²). The molecular weight of the PAG is 565, so it is approximately $80.0 \times 10^{-15}$ mol/cm² $\approx 1.0 \times 10^{-13}$ cm² ($45 \times 10^{-12}$ g/cm²/565). Specifically, the allowable amount of elution of the PAG per unit area of the substrate P is $1.0 \times 10^{-13}$ mol/cm².

Note that, as discussed above, there is a possibility that, in addition to the PAG, amine group substances, etc. will also be eluted from the substrate P (photosensitive material 2), so the concentration of the amine group substance should be set by a procedure similar to die above. For example, the molecular weight, which is a physical property value peculiar to the amine group substance, is 521, and if, as a result of having performed an experiment similar to the experiment discussed above, the ratio of amount of light $I_P$ and amount of light $I_P'$ was 24.4%, the concentration of that amine group substance should be set to approximately $2.0 \times 10^{-14}$ mol/cm² or less.

On the other hand, it is conceivable that there will be relatively little amine group substance, as the eluted substance eluted into die liquid LQ from the substrate P, compared to the PAG and the occurrence of clouding of the first optical element LS1 will be mainly attributable to the PAG. Therefore, by mainly controlling (setting) the concentration of the PAG in the liquid LQ, it is possible to preferably restrict clouding of the first optical element LS1 attributable to the eluted substance eluted into the liquid LQ from the substrate P.

Application Example 4

Application Example 3 discussed above obtains the allowable concentration and the allowable amount of elution of the PAG in the liquid LQ in the case in which the concentration of the eluted substance in the liquid LQ of the optical path space K1 is uniform. In the present application example, as was explained while referring to FIG. 5, the allowable concentration and the allowable amount of elution of the PAG in the liquid LQ in the case where a high concentration area $A_H$ and a low concentration area $A_L$ are respectively formed in the liquid LQ of the optical path space K1 are obtained. In the present application example, the ratio R ($=Dn_L/Dn$) of the average concentration Dn and the concentration $Dn_L$ of the low concentration area $A_L$ is set to $1/73$.

For the specification (target condition), in the same way as in Application Example 3, when the amount of light of the exposure light EL at a first point in time is $I_P$, and the amount of light at a second point in time after a prescribed time has elapsed from the first point in time (here, one year after) is $I_P'$, setting the ratio ($I_P'/I_P$) of amount of fight $I_P$ and amount of light $I_P'$ to 99.9% or more is considered the specification (target condition).

In Application Example 3, the concentration c was set to approximately 1.4 ppm, but in the present application example, the allowed concentration "c" taking into account the ratio R is 102.2 ppm (1.4 ppm×73).

In the same way as in Application Example 3, the number of pulses of the ArF excimer laser apparatus, which emits the beam for experimentation, is $1.4 \times 10^6$ in thirty minutes. On the other hand, in the case where the number of pulses of the light source of the exposure light EL of the exposure apparatus EX (ArF excimer laser apparatus) is $1.0 \times 10^{10}$ in one year, the ratio of the number of pulses of the experimentation apparatus 300 and the exposure apparatus EX is 7000 ($1.0 \times 10^{10}/1.4 \times 10^6$). Therefore, in the exposure apparatus EX, by restricting the concentration of PAG in the liquid LQ that is filled into the optical path space K1 to approximately 14.6 ppb (102.2 ppm/7000) or less, it is possible to satisfy the above specifications. This concentration is the average concentration of the eluted substance (PAG) in the liquid LQ that has been filled into the optical path space K1, so in the low concentration area $A_L$, it becomes a value that corresponds to the ratio R, specifically, 0.2 ppb (14.6 ppb/73). In addition, when the liquid LQ that has been set to this concentration is filled into the optical path space K1 of the exposure apparatus EX, it is possible to restrict clouding of the first optical element LS1, and it is possible to set the ratio of the amount of light (amount of light at a first point in time) $I_P'$ before clouding occurs in the first optical element LS1 and the amount of light (amount of light at a second point in time) $I_P$ after clouding has occurred to 99.9% or higher ($I_P'/I_P \geq 99.9\%$).

Next, when liquid immersion exposure of the substrate P is performed using the exposure apparatus EX explained while referring to FIG. 1, the allowable elution amount per unit area of the PAG eluted from the substrate P for satisfying die above specification is obtained. The amount of the liquid LQ used when liquid immersion exposure treatment of one substrate P is performed is approximately 110 g. Therefore, in order to satisfy the above specification, the total weight of PAG allowed becomes $1606 \times 10^{-9}$ g (110 g×14.6 ppb) even if eluted into the liquid LQ from the substrate P during liquid immersion exposure treatment of one substrate P. Specifically, the total weight of PAG that it is allowable to elute from die photosensitive material 2 during the exposure processing time (20 seconds) for one substrate P is $1606 \times 10^{-9}$ g.

In the case where the substrate P is of a cylindrical shape with a diameter of 300 mm, the area of the substrate P becomes approximately 706 cm², so die allowable amount of elution of the PAG per unit area of the substrate P is approximately $2.2 \times 10^{-9}$ g/cm² ($1606 \times 10^{-9}$ g/706 cm²). In the present embodiment, PAG with a molecular weight of 500 was used, so it is approximately $4.4 \times 10^{-12}$ mol/cm² ($2.2 \times 10^{-9}$ g/cm²/500). Specifically, the allowable amount of elution of the PAG per unit area of the substrate P is $4.4 \times 10^{-12}$ mol/cm².

Note that, as discussed above, there is a possibility that amine group substances, etc. will also be eluted from the substrate P (photosensitive material 2) in addition to the PAG, so the allowable amount of elution of the amine group substance can be set by the same procedure as the allowable amount of elution of the PAG. For example, the molecular weight, which is a physical property value peculiar to die amine group substance, is 500, and if, as a result of having performed an experiment similar to the experiment discussed above, the ratio of amount of light $I_P$ and amount of light $I_P'$ was approximately 56.8%, the allowable amount of elution of that amine group substance taking into account the ratio R ($=1/73$) of the average concentration Dn and the concentration $Dn_L$ of the low concentration area $A_L$ is approximately $1.1 \times 10^{-9}$ g/cm² (approximately $2.2 \times 10^{-12}$ mol/cm²) or less.

Note that, in the respective application examples discussed above, the allowable amount of elution of the substance eluted into the liquid LQ from the) substrate P based on the transmittance $R_P$ of the liquid LQ that has been filled into the optical path space K1 as well as the allowable amount of elution of the substance eluted into the liquid LQ from the substrate P based on the transmittance $R_G'$ of the liquid contact surface LSA of the first optical element LS1 are obtained, but the smaller of the allowable amounts of elution, specifically, the allowable amount of elution of the substance eluted into the liquid LQ from the substrate P based on the transmittance $R_G'$ of the liquid contact surface LSA of the first optical element LS1, should be set as the allowable amount of elution of the substance eluted into the liquid LQ from the substrate P.

Application Example 5

In the present application example, the allowable concentration and the allowable amount of elution of the PAG in the liquid LQ in the case where a nozzle member 70 such as that explained while referring to FIG. 7 is used will be obtained. In the present application example, die ratio R ($=Dn_L/Dn$) of the average concentration Dn and concentration $Dn_L$ of the low concentration area $A_L$ is set to $\frac{1}{80}$.

For the specification (target conditions), in the same way as in Application Example 4, when the amount of light of the exposure light EL at a first point in time is $I_P$, and the amount of light at a second point in time after a prescribed time has elapsed from the first point in time (here, one year after) is $I_P'$, setting the ratio ($I_P'/I_P$) of amount of light $I_P$ and amount of light $I_P'$ to 99.9% or more is considered the specification (target condition).

In the present application example, die allowable concentration "c" taking into account the ratio R is 112.0 ppm (1.4 μm×80).

The number of pulses of the ArF excimer laser apparatus, which emits the beam for experimentation, is $1.4\times10^6$ in thirty minutes. On the other hand, in the case where the number of pulses of the light source (ArF excimer laser apparatus) of the exposure light EL of the exposure apparatus EX is $1.0\times10^{10}$ in one year, the ratio of the number of pulses of the experimentation apparatus 300 to the exposure apparatus EX is 7000 ($1.0\times10^{10}/1.4\times10^6$). Therefore, in the exposure apparatus EX, by restricting the concentration of PAG in the liquid LQ that is filled into the optical path space K1 to approximately 16.0 ppb (112.0 ppm/7000) or less, it is possible to satisfy the above specifications. This concentration is the average concentration of the eluted substance (PAG) in the liquid LQ that has been filled into the optical path space K1, so in the low concentration area $A_L$, it becomes a value that corresponds to the ratio R, specifically, 0.2 ppb (16.0 ppb/80). In addition, by filling the liquid LQ that has been set to this concentration into the optical path space K1 of the exposure apparatus EX, it is possible to restrict clouding of the first optical element LS1, and it is possible to set the ratio of the amount of light (amount of light at a first point in time) $I_P'$ before clouding occurs in the first optical element LS1 and the amount of light (amount of light at a second point in time) $I_P$ after clouding has occurred to 99.9% or higher ($I_P'/I_P \geq 99.9\%$).

Next, when liquid immersion exposure of the substrate P is performed using the exposure apparatus EX explained while referring to FIG. 1, the allowable elution amount per unit area of the PAG eluted from the substrate P for satisfying the above specifications is obtained. The amount of the liquid LQ used when liquid immersion exposure treatment of one substrate P is performed is approximately 110 g. Therefore, in order to satisfy the above specification, the total weight of PAG allowed becomes $1760\times10^{-9}$ g (110 g×16.0 ppb) even if eluted into the liquid LQ from the substrate P during liquid immersion exposure treatment of one substrate P. Specifically, the total weight of PAG that it is allowable to elute from the photosensitive material 2 during the exposure processing time (20 seconds) for one substrate P is $1760\times10^{-9}$ g.

In the case where the substrate P is of a cylindrical shape with a diameter of 300 mm, the area of die substrate P becomes approximately 706 cm², so the allowable amount of elution of the PAG per unit area of the substrate P is approximately $2.5\times10^{-9}$ g/cm² ($1760\times10^{-9}$ g/706 cm²). In present embodiment, PAG with a molecular weight of 500 was used, so it is approximately $5.0\times10^{-12}$ mol/cm² ($2.5\times10^{-9}$ g/cm²/500). Specifically, the allowable amount of elution of the PAG per unit area of the substrate P is $5.0\times10^{-12}$ mol/cm².

Note that, in the embodiments discussed above, the fact that the ratio ($I_P/I_P'$) of amount of light $I_P$ at a first point in time and amount of light $I_P'$ at a second point in time is set to 99.9% or more is considered the target condition, but it is possible to increase the allowable amount of elution of the PAG, amine, etc. by making this target condition smaller, for example, by setting it to 99.5%.

In addition, in the case where an anion is eluted from the substrate P, it is possible to obtain the allowable amount of elution of die anion in the same way as die PAG or the amine. For example, it is possible to set die allowable amount of elution of the anion to 10 ng/cm² or less.

First Embodiment of Processing for Satisfying the Above Conditions

In order to satisfy Equations (1), (1'), (2) and (2') above, it is desirable that a photosensitive material 2 that has little elution of the PAG, amine etc. into the liquid LQ be used, but there are also cases in which it is possible to satisfy Equations (1), (1'), (2) and (2') above by implementing prescribed processing.

Next, a first embodiment of processing for satisfying the conditions of Equations (1), (1'), (2) and (2') above will be explained. In the present embodiment, before the liquid LQ for forming the liquid immersion area LR is arranged on the substrate P, that substrate P is immersed in a separate second liquid LQ'. In the following explanation, a substance (PAG amine group substance, etc) that has the ability to be eluted into the liquid LQ from among the substances included in the photosensitive material 2 will be called "the prescribed substance" as appropriate. Note that, as discussed above, the substance after elution into the liquid LQ has been performed will be referred to as "the eluted substance" as appropriate.

Figure 10:
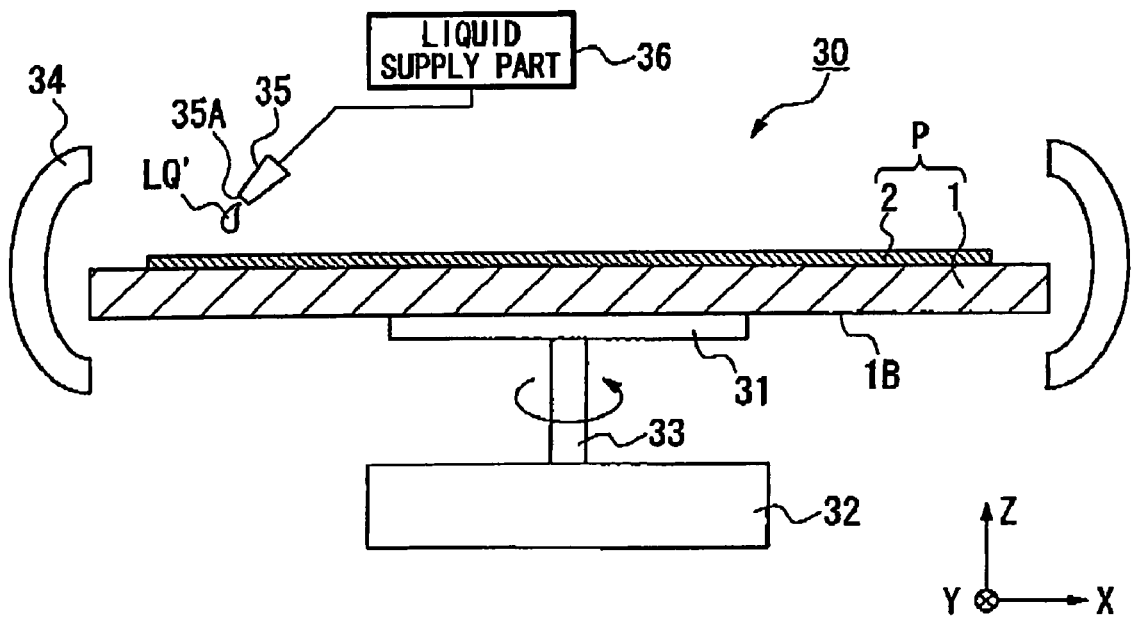
FIG. 10 is a drawing that shows an example of an immersion apparatus used in immersion processing.

FIG. 10 is a drawing that shows the liquid immersion apparatus 30. The liquid immersion apparatus 30 immerses die substrate P in the second liquid LQ' under prescribed immersion conditions determined in advance based on information relating to the substrate P. In FIG. 10, the liquid immersion apparatus 30 comprises a holder part 31, which holds the center part of the lower surface of the substrate P (lower surface 1B of the base material 1), shaft part 33, which connects to the holder part 31, a rotation mechanism 32, which rotates the holder part 31, which holds the substrate P, via the shaft part 33, a ring-shaped member 34, which is provided so as to surround the vicinity of the substrate P which is held by the holder part 31 to prevent dispersion; of the liquid, and a liquid supply part 36, which supplies the second liquid LQ' onto the substrate P via the supply port 35A of a simply member 35. A vacuum chucking hole, which configures a portion of the vacuum apparatus, is provided on the upper surface of the holder part 31, and the holder part 31 vacuum holds the center part of the lower surface of the substrate P. The rotation mechanism 32 includes an actuator such as a motor, and it rotates the substrate P, which is held by the holder part 31, by rotating the shaft part 33 that is connected to the holder part 31. The rotation mechanism 32 rotates the holder part 31, which holds the substrate P, in the θZ direction in the drawing a prescribed number of times per unit time. The supply member 35 is arranged above the substrate P held by the holder part 31 and has a supply part 35A, which supplies the second liquid LQ'. The second liquid LQ', which has been delivered from the liquid supply part 36, is supplied to the upper surface of the substrate P from above the substrate P via the supply part 35A of the supply member 35. In addition, the supply member 35 is able to move in the X axis, Y axis, Z axis, θX, θY, and θZ directions by means of a drive mechanism that is not shown in the drawing. Specifically, the supply member 35 is able to move relative to the substrate P held by the holder part 31. The immersion apparatus 30 is able to immerse the entire surface of the substrate P in the second liquid LQ' by moving the supply member 35 relative to the substrate P. In addition, the immersion apparatus 30 is able to adjust the direction in which second liquid LQ' is supplied with respect to the substrate P and the distance between the supply part 35A and the substrate P by moving the supply member 35 relative to the substrate P. In addition, the liquid supply part 36 is able to continuously or intermittently supply the second liquid LQ' onto the substrate P via the supply part 35A of the simply member 35. In addition, the liquid supply part 36 is able to adjust the temperature of the supplied second liquid LQ' and the amount of the second liquid LQ' supplied per unit time (including the flow volume and the flow rate). Note that the relative movements of the supply member 35 and the substrate P are not limited to the movement of the supply member 35 but the substrate P may also be moved, and both of these may be moved.

The liquid immersion apparatus 30 supplies the second liquid LQ' to the substrate P, which is held by the holder part 31, from the supply part 35A of die supply member 35 and immerses the substrate P in the second liquid LQ'. The photosensitive material 2 that has been coated onto the upper surface 1A of the base material 1 of the substrate P is adequately immersed by the second liquid LQ' supplied from the supply member 35.

In the present embodiment, the liquid immersion apparatus 30 rotates the substrate P, which is held by the holder part 31, in the θZ direction in the drawing by means of the rotation mechanism 32 while moving the supply member 35 relative to the X axis direction with respect to the substrate P held by the holder part 31 and while continuously supplying the second liquid LQ' from the liquid supply member 35. Through this, die second liquid LQ' is supplied to nearly the entire surface of the upper surface of the substrate P. Therefore, the liquid immersion apparatus 30 is able to immerse nearly the entire surface of the photosensitive material 2 using the second liquid LQ'. In addition, a ring-shaped member 34 is provided in the vicinity of the substrate P held by the holder part 31, so it is possible to prevent dispersion of the second liquid LQ' attributable to rotation of the substrate P by means of the ring-shaped member 34.

In the present embodiment, the second liquid LQ' used in immersion processing is the same as the liquid LQ supplied onto the substrate P for liquid immersion exposure treatment. Specifically, in the present embodiment, the second liquid LQ' is pure water that has been controlled to a prescribed purity (degree of cleanliness) and a prescribed temperature in the same way as the liquid LQ. Of course, if it is one in which it is possible to elute in advance the substance eluted when the substrate P has been immersed in the liquid LQ, the second liquid LQ' may be one that is different from the liquid LQ. For example, it is possible to use ozone water as the second liquid LQ'.

Figure 11:
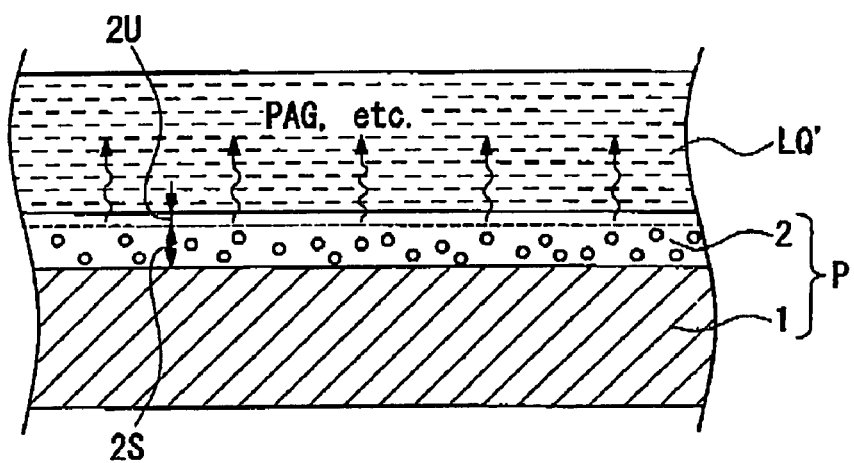
FIG. 11 is a schematic drawing for explaining the condition; in which the eluted substance is eluted into a second liquid by immersion processing.

FIG. 11 is a schematic view that shows a status in which the photosensitive material 2 of the substrate P has been immersed in the second liquid LQ'. When the photosensitive material 2 comes into contact with the liquid, a constituent of a portion of the photosensitive material 2, specifically, PAG or an amine group of substance, etc elutes into the liquid.

In FIG. 11, the photosensitive material 2 is immersed in the second liquid LQ', and a prescribed substance such as PAG or an amine group substance is eluted into the second liquid LQ' from the photosensitive material 2. Here, it has been confirmed that, when the upper surface of the photosensitive material 2 and the second liquid LQ' have come into contact, although a prescribed substance (such as PAG or an amine group substance) that is present in a first area 2U of a prescribed thickness (for example, approximately 5 to 10 nm) is eluted from the upper surface of the photosensitive material 2 into the second liquid LQ', the prescribed substance that is present in a second area 2S of the lower layer thereof is hardly eluted at all into the second liquid; LQ'. Moreover, after a prescribed period of time (for example, several seconds to several tens of seconds) has elapsed after the upper surface of the photosensitive material 2 and the second liquid LQ' hove been brought into contact, the prescribed substance eluted from the first area 2U with respect to the second liquid LQ' is hardly present at all. Specifically, after a prescribed period of time has elapsed after the upper surface of the photosensitive material 2 and the second liquid LQ' have been brought into contact, a status in which the prescribed substance that is present in the first area 2U of the photosensitive material 2 is nearly completely eluted results, and the prescribed substance is hardly eluted at all any longer from the photosensitive material 2 to the second liquid LQ'. In addition, this prescribed time changes according to the photosensitive material 2.

Therefore, as discussed above, even if the liquid LQ for forming the liquid immersion area LR were arranged on the substrate P (photosensitive material 2) after immersion processing has been performed for a prescribed period of time with the second liquid LQ', the prescribed substance would be hardly eluted at all into the liquid LQ from the substrate P (photosensitive material 2).

After immersion processing with respect to the substrate P has been performed, processing for removal of the second liquid LQ' on the substrate P is performed. When processing for removal of the second liquid LQ' is performed, the immersion apparatus 30 stops supply of the second liquid LQ' by means of the liquid supply part 36, or it gradually reduces the supplied amount while rotating the holder part 31, which holds the substrate P, using the rotation mechanism 32. The immersion apparatus 30, by using the rotation mechanism 32 to rotate the substrate P for a prescribed number of rotations per unit time, causes the second liquid LQ', which has adhered to the substrate P, to disperse from the substrate P by means of the action of centrifugal force.

The immersion conditions for immersion processing the substrate P are set according to information relating to the substrate P. The immersion time that the substrate P is immersed in the second liquid LQ' is included among the immersion conditions. In addition, information on the photosensitive material 2 is included in the information relating to the substrate P. Included in the photosensitive material 2 information is information relating to the forming material that forms die photosensitive material 2 and the elution time of a prescribed substance of a portion of the photosensitive material 2 to go into the second liquid LQ'. Note that the forming material that forms the photosensitive material 2 includes the base resins discussed above, PAG, and amine group substances. The time (elution time) from when the photosensitive material 2 and the second liquid LQ' are brought into contact until the prescribed substance is nearly completely eluted from the photosensitive material 2 (first area 2U of the photosensitive material 2) changes according to the physical properties of the forming material that forms the photosensitive material 2 and the amount of the prescribed substance, such as PAG that is included. In addition, the time (elution time) from when die photosensitive material 2 and the second liquid LQ' are brought into contact until elution of the prescribed substance is started also changes according to the photosensitive material 2. Therefore, by optimally setting the immersion conditions, including the immersion time, according to information relating to the substrate P, which includes information of the photosensitive material 2, it is possible to cause the prescribed substance discussed above to nearly completely elute into the second liquid LQ' from die photosensitive material 2 (first area 2U).

In addition, the removal conditions of the second liquid LQ' are also included in the immersion conditions. Examples of the removal conditions of the second liquid LQ' are the number of rotations per unit time (rotation speed) of the substrate P by the rotation mechanism 32, the rotation acceleration, the time (rotation time) during which rotation of the substrate P is being executed, etc. Or, examples of the removal conditions of the second liquid LQ' are the rotation speed profile, the rotation acceleration profile, etc. of the rotation apparatus 32. The time that the second liquid LQ' is in contact with the substrate P (mat is, the immersion time) and the velocity of movement of the second liquid LQ' on the substrate P change according to the removal conditions of the second liquid LQ'. For this reason, also by optimally setting the removal conditions according to information relating to the substrate P, it is possible to cause the prescribed substance discussed above to be nearly completely elute into the second liquid LQ' from the photosensitive material 2 (first area 2U).

In addition, the temperature of the supplied second liquid LQ' is another example of an immersion condition. In addition, as in the present embodiment, in the case of a mode in which the second liquid LQ' is supplied to the substrate P from the supply port 35A of the supply member 35, the amount of supplied second liquid LQ' per unit time (including the flow volume and the flow rate), tin supply pressure when supplying the second liquid LQ', and the direction in which the second liquid LQ' is caused to flow with respect to the substrate P can also be given as examples of the immersion conditions.

After the second liquid LQ' has been removed from on top of the substrate P, temperature adjustment of the substrate P is performed. When the second liquid LQ' that has collected on the substrate P is removed, there is a possibility that the substrate P will change temperature and become a different temperature than the prescribed temperature due to the heat of vaporization of the second liquid LQ'. Therefore, temperature adjustment of the substrate P is performed to compensate for temperature changes of the substrate P attributable to the heat of vaporization when the second LQ' is removed.

After temperature adjustment of the substrate P has been performed, the substrate P is conveyed (loaded) to the substrate holder PH of the exposure apparatus EX. The control apparatus CONT uses the liquid immersion mechanism 100 to form a liquid immersion area LR of the liquid LQ at the top of the substrate. Then, the control apparatus CONT uses the liquid immersion mechanism 100 to perform supply of the liquid LQ onto the substrate P and recovery of the liquid LQ from on top of the substrate P while irradiating the exposure light EL onto the substrate P via the liquid LQ and performing liquid immersion exposure of the substrate P.

In the present embodiment, the substrate P is immersed in the second liquid LQ' before the liquid LQ for forming the liquid immersion area LR is arranged on top of the substrate P, so, as discussed above, even in the case in which the liquid LQ has again been brought into contact with the photosensitive material 2 that has been immersion processed using the second liquid LQ', it is possible to adequately restrict the amount of eluted substance eluted from the photosensitive material 2 with respect to the liquid LQ. Therefore, it is possible to adequately reduce the concentration Dn of the eluted substance in the liquid LQ, and it is possible to satisfy die conditions) of Equations (1), (1'), (2) and (2') above.

Figure 12:
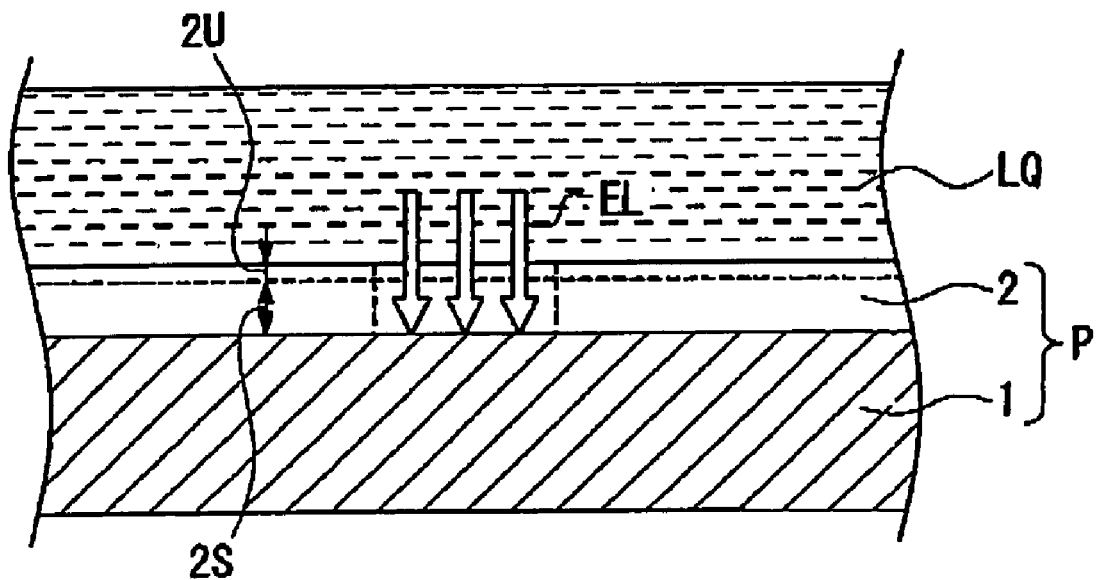
FIG. 12 is a schematic drawing that shows a status in which; exposure light is being irradiated onto the substrate.

In addition, PAG is hardly present at all in the first area 2U of the photosensitive material 2, but as shown in the schematic view of FIG. 12, the exposure light EL that has been irradiated to the photosensitive material 2 of the substrate P is able to pass through die first area 2U and reach die second area 2S where the PAG is present.

After liquid immersion exposure of the substrate P has ended, the control apparatus CONT stops supply of the liquid LQ by the liquid supply mechanism 10 while continuing driving of the liquid recovery mechanism 20 and recovering the liquid LQ on the substrate P and on the substrate stage PST to remove it. After the substrate P for which exposure processing has been completed has been unloaded from the substrate holder PH, heat treatment (post bake) called PEB (post exposure bake) is performed. In a chemically amplified resist, acid is generated from the PAG due to irradiation of the exposure light EL. Then, by performing post bake on the chemically amplified resist after the exposure light EL has been irradiated, alkali solubility is generated in an area that corresponds to the irradiation area (pattern of the mask M) of the exposure light EL.

Figure 13:
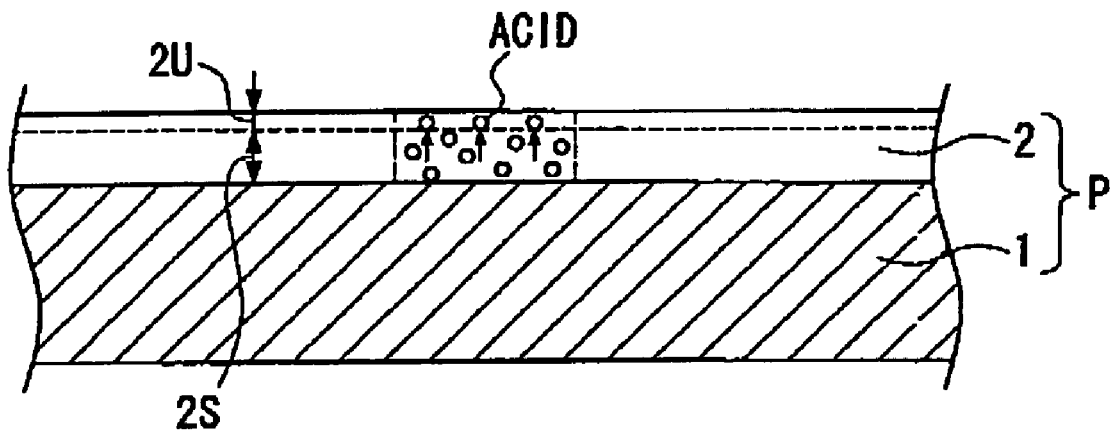
FIG. 13 is a schematic drawing that shows the behavior of a substrate on which heat treatment is being performed.

FIG. 13 is a drawing that schematically shows the behavior of the photosensitive material 2 on which post bake (PEB) is being performed. Through immersion processing by the immersion apparatus 30, the PAG is hardly present at all in the first area 2U of the photosensitive material 2, so after the exposure light EL has been irradiated to the photosensitive material 2, acid attributable to the PAG is hardly generated that all in the first area 2U of the photosensitive material 2. On the other hand, since the PAG is adequately present in the second area 2S of the photosensitive material 2, acid from the PAG is adequately generated in the second (area 2S by means of the irradiation of the exposure light EL. When post bake is performed on the substrate P, which includes the photosensitive material 2 in such a status, as shown in FIG. 13, a phenomenon occurs in which the acid that is in the second area 2S expands to the first area 2U. Specifically, after exposure, hardly any acid that all is present in the first area 2U, but by performing post bake, the acid that is present in the second area 2S is offset in the first area 2U. Then, in a status in which the acid has been offset in the first area 2U, by further continuing post bake, it is possible to generate alkali solubility in an area of the photosensitive material 2 that corresponds to the irradiation area (pattern of die mask M) of the exposure light EL. Then, the substrate P on which post bake has been performed undergoes development processing. Through this, the desired pattern is formed on the substrate P.

Second Embodiment of Processing for Satisfying the Above Conditions

Next, a second embodiment for satisfying the conditions of Equations (1), (1'), (2) and (2') above will be explained. In the present embodiment, elution of the eluted substance is restricted and the conditions of Equations (1), (1'), (2) and (2') above will be satisfied by covering the substrate P with a thin film.

Figure 14:
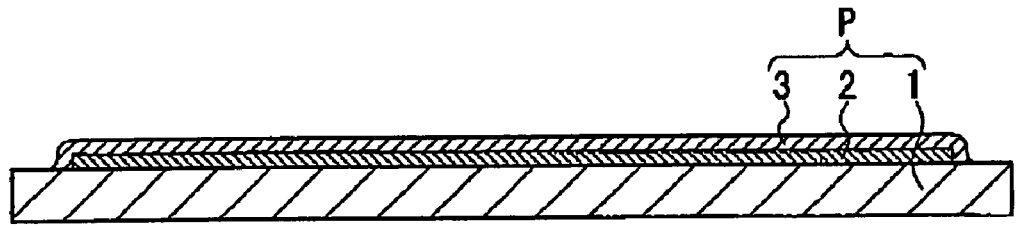
FIG. 14 is a cross sectional view of mother embodiment of a substrate.

As shown in FIG. 14, the substrate P comprises a thin film 3 that covers the photosensitive material 2. Examples of this thin film 3 are a reflection preventing film (top ARC), a top coat film (protective film), etc. In addition, there are cases in which the thin film 3 is a top coat film that covers die reflection preventing film formed on photosensitive material 2. The top coat film is for protecting the photosensitive material 2 from the liquid, and it is formed of a fluorine group liquid repellent material for example.

Figure 15:
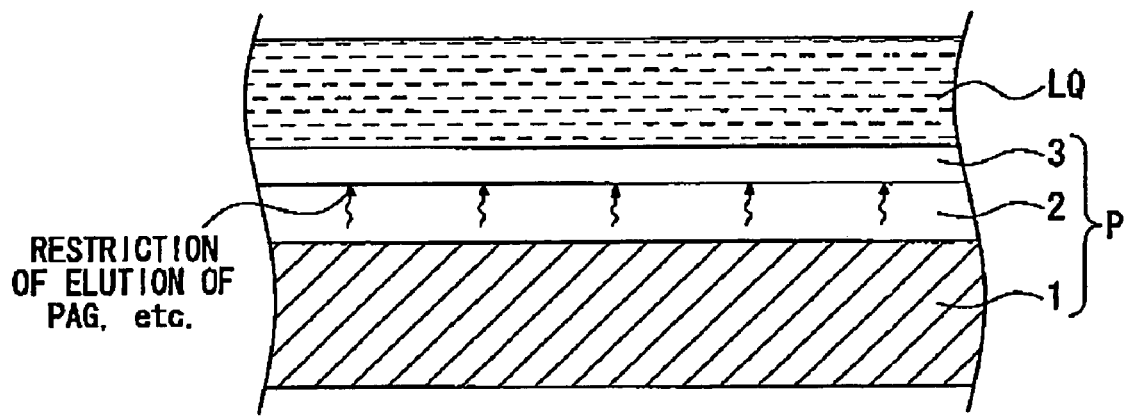
FIG. 15 is a schematic drawing that shows the condition in which elution of the eluted substance into the liquid is being restricted.

As shown in die schematic drawing a FIG. 15, by providing a thin film 3, even if the substrate P comes into the contact with the liquid LQ, it is possible to restrict elution of the eluted substance from the photosensitive material 2 to die liquid LQ. Therefore, even in the case in which the liquid LQ for forming the liquid immersion area LR has been arranged on the substrate P, it is possible to restrict the concentration Dn of the eluted substance in that liquid LQ, and it is possible to satisfy the conditions of Equations (1), (1'), (2) and (2') above.

Third Embodiment of Processing for Satisfying the Above Conditions

Next, a third embodiment for satisfying the conditions of Equations (1), (1'), (2) and (2') above will be explained. In the present embodiment, the conditions of Equations (1), (1'), (2) and (2') above will be satisfied by adjusting at least one of the liquid simply of amount or the liquid recovery amount per unit time by the liquid immersion mechanism 100. Specifically, the control apparatus CONT is able to disperse the eluted substance using the flow of the liquid LQ and prevent a status in which the eluted substance collects in the optical path space K1 of the exposure light EL even if an eluted substance such as PAG is eluted into the liquid LQ from the substrate P by respectively increasing the liquid supply amount and the liquid recovery amount per unit time by the liquid immersion mechanism 100 and increasing the flow rate of the liquid LQ. In addition, it is possible to restrict rises in the concentration Dn of the eluted substance in the liquid LQ, and, in turn, it is possible to restrict temperature changes and refractive index changes of the liquid LQ by respectively increasing the liquid supply amount and the liquid recovery amount per unit time by the liquid immersion mechanism 100 and always supplying a large quantity of clean liquid (pure solution) LQ onto the substrate P.

Fourth Embodiment of Processing for Satisfying the Above Conditions

Next, a fourth embodiment for satisfying the conditions of Equations (1), (1'), (2) and (2') above will be explained. In the present embodiment, when the projection optical system PL and the substrate P are moved relatively while performing exposure, the conditions of Equations (1), (1'), (2) and (2') above will be satisfied by adjusting the movement velocity thereof. As discussed above, the exposure apparatus EX of the present embodiment is a scanning type ex mask M onto the substrate P while synchronously moving the mask M and substrate P. The control apparatus CONT adjusts the movement velocity of die substrate P with respect to the projection optical system PL by adjusting the movement velocity of the substrate P (substrate stage PST).

Figure 16:
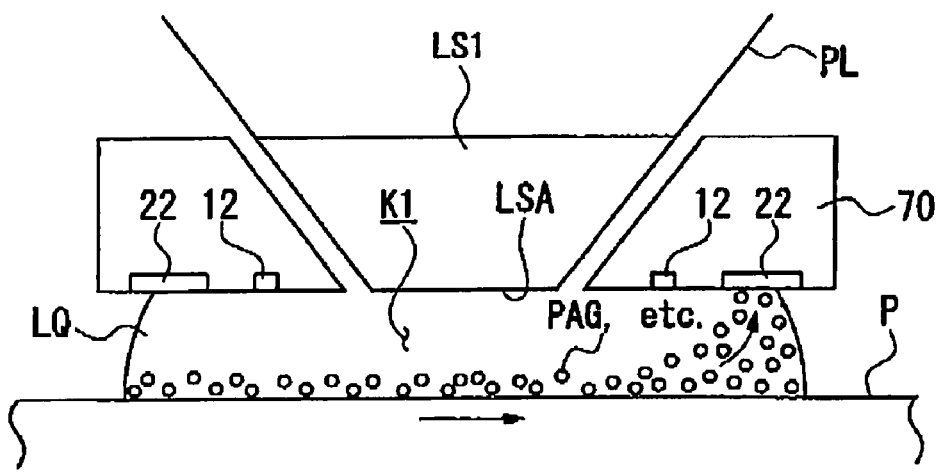
FIG. 16 is a schematic drawing that shows the movement status of the substrate.

FIG. 16 is the schematic drawing that shows a status in which the substrate P is moving with respect to the projection optical system PL in a status in which the optical path space K1 between the projection optical system PL and the substrate P has been filled with the liquid LQ. The control apparatus CONT, by increasing the movement velocity of the substrate stage PST, is able to prevent the eluted substance that has been eluted into the liquid LQ from the substrate P from dispersing into the entire liquid LQ of the liquid immersion area LR and is able to prevent a status in which the eluted substance that has been eluted from the substrate P reaches the lower surface LSA of the projection optical system PL and collects in the optical path space K1 of the exposure light EL. As discussed above, this does not mean that the eluted substance such as PAG from the substrate P (photosensitive material 2) instantly disperses evenly into the liquid LQ but a high concentration area is formed in the vicinity of the surface of the substrate P. Due to the substrate P moving in this status, sheer force is generated in the lower layer area (specifically, the high concentration area) of the liquid LQ in conjunction with the movement of die substrate P, and it is possible to cause the eluted substance that is present in the high concentration area to move to the recovery port 22. Then, by increasing the movement velocity of the substrate P, before the eluted substance that is present in high concentration area is dispersed into the liquid LQ, it is possible to quickly recover that eluted substance via the recovery port 22. Therefore, it is possible to restrict a rise in the concentration of eluted substance in the liquid LQ and, in turn, it is possible to restrict temperature changes and refractive index changes of the liquid LQ. Particularly, through the method of the present embodiment, although a high concentration area is formed in the liquid LQ, it is possible to prevent diffusion of the eluted substance in that high concentration area, so it is possible to decrease the average concentration of the eluted substance in the Z axis direction (optical axis direction of the exposure light EL) in the liquid LQ that has been filled into die optical path space K1. Therefore, through the method of die present embodiment, it is possible to satisfy the condition of Equation (2') above.

Note that, in die respective embodiments discussed above, the case in which a chemically amplified resist was used as the photosensitive material 2 was explained as an example, but it may also be a novolac resin group resist, for example, which does not include PAG. In mat case as well, by setting the concentration of the eluted substance in the liquid LQ that is arranged on the substrate P so as to satisfy Equations (1), (1'), (2) and (2'), it is possible to cause the exposure light EL to preferably reach onto the substrate P.

In addition, in the respective embodiments discussed above, in order to simplify the explanation, the case in which the photosensitive material 2 is coated onto the base material 1 was explained, but in the case in which a pattern layer is formed on the base material 1 after having already gone through a number of exposure processes, elution of the material that forms a pattern layer into a liquid may also be considered.

As discussed above, the liquid in the present embodiment is pure water. Pure water has advantages in that it can be easily obtained in large quantity at semiconductor fabrication plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned.

Note that, in the case where the purity of the pure water supplied from the plant, etc. is low, the exposure apparatus may be such that it has ultra pure water manufacturing equipment.

In addition, the index of refraction n of pure water (water) with respect to exposure light EL with a wavelength of approximately 193 nm is said to be nearly 1.44, so in the case where ArF excimer laser light (193 nm wavelength) is used as the light source of the exposure light EL, on the substrate P, it is possible to shorten the wavelength to 1/n, that is, approximately 134 nm, to obtain high resolution. Also, the depth of focus is expanded by approximately n times, that is approximately 1.44 times, compared with it being in air, so in the case where it would be allowable to ensure the same level of depth of focus as the case in which it is used in air, it is possible to further increase the numerical aperture of the projection optical system PL, and resolution improves on this point as well.

Note that, when a liquid immersion method such as that discussed above is used, the numerical aperture NA of the projection optical system may at times become 0.9 to 1.3. In this way, in the case in which die numerical aperture NA of the projection optical system becomes larger, image formation performance may deteriorate due to a polarization effect with the random polarized light conventionally used as the exposure light, so it is preferable that polarized light illumination be used. In that case, linear polarization illumination to march the lengthwise direction of die line pattern of the line and space pattern of the mask (reticle) is performed, and refracted light of the S polarization component (TE polarization component), that is, the polarization direction component along die lengthwise direction of the line pattern, may be irradiated from die mask (reticle) pattern in large quantities. In the case in which the space between the projection optical system PL and the resist coated onto the surface of the substrate P is filled with a liquid, the transmittivity of the refracted light of the S polarization component (TE polarization component) at the resist surface, which contributes to the improvement of contrast, is higher than that of the case in which the space between the projection optical system PL and the resist coated onto the upper surface of the substrate P is filled with air (gas), so high image formation performance can be obtained even in such cases as when the numerical aperture NA of the projection optical system exceeds 1.0. In addition, it is even more effective when a phase shift mask or a grazing incidence illumination method (particularly, the dipole illumination method) matching the lengthwise direction of the line pattern, such as that disclosed in Japanese Unexamined Patent Application Publication No. H6-188169, is appropriately combined. In particular, a combination of the linear polarization illumination method and the dipole illumination method is effective in the case in which the circumferential direction of the line and space pattern is limited to a prescribed direction and in the case in which the hole pattern is densely concentrated along a prescribed direction. For example, in the case in which a halftone type phase shift mask with a transmittivity of 6% (pattern with a half pitch of approximately 45 nm) is illuminated by jointly using the linear polarization illumination method and the dipole illumination method, when the illumination a defined at the circumscribed circle of the two light beams that form the dipole at the pupil plane of the illumination system is 0.95, the radius of the respective light beams at that pupil plane is 0.125σ, and the numerical aperture of the projection optical system PL is NA=1.2, it is possible to increase depth of focus (DOF) approximately 150 nm more than when random polarized light is used.

In addition, a combination of linear polarization illumination and the small σ illumination method (an illumination method in which the σ value, which shows the ratio of the numerical aperture NAi of the illumination system and the numerical aperture NAp of the projection optical system, is 0.4 or less) is also effective.

In addition, for example, in the case where an ArF excimer laser is used as the exposure light, and a projection optical system PL with a reduction rate of approximately ¼ is used to expose a fine line and space pattern (for example, lines and spaces of approximately 25 to 50 nm) onto the substrate P, depending on the structure of the mask M (for example, the degree of fineness of the pattern and the thickness of the chrome), the mask M acts as a polarization plate due to the wave guide effect, and more refracted light of the S polarization component (TE polarization component) emerges from the mask M than refracted light of the P polarization component (TM polarization component), which reduces contrast. In this case, it is preferable that the linear polarization illumination discussed above be used, but even in the case in which the numerical aperture NA of the projection optical system PL is large at 0.9 to 1.3 even though the mask M is illuminated by random polarized light, it would be possible to obtain high resolution performance.

In addition, in a case such as one where an extremely fine line and space pattern on the mask M is exposed onto die substrate P, there is a possibility that the P polarization component (TM polarization component) will be larger than the S polarization component (TE polarization component) due to the wire grid effect, but, for example, if the conditions are such that ArF excimer laser light is used as the exposure light, and a projection optical system PL with a reduction rate of approximately ¼ is used to expose a line and space pattern larger than 25 nm onto the substrate P, more refracted tight of the S polarization component (TE polarization component) will emerge from the mask than refracted light of the P polarization component (TM polarization component), so it would be possible to obtain high resolution performance even in the case in which the numerical aperture NA of the projection optical system PL becomes large at 0.9 to 1.3.

In addition, as disclosed in Japanese Unexamined Patent Application Publication No. H6-53120, not only linear polarization illumination (S polarization illumination) that matches the lengthwise direction of the line pattern of the mask (reticle) but a combination of a polarization illumination method that linearly polarizes in the tangential (circumferential) direction of a circle centering on the optical axis and the grazing incidence method is also effective. In particular, in the case where not only a line pattern in which the pattern of the mask (reticle) extends in one prescribed direction but a line pattern that extends in a plurality of different directions are intermingled (line and space patterns with different circumferential directions are intermingled), as disclosed in the same Japanese Unexamined Patent Application Publication No. H6-53120, by jointly using a polarization illumination method that linearly polarizes in the tangential direction of a circle centering on the optical axis and the zonal illumination method, it is possible to obtain high resolution performance even in the case in which the numerical aperture NA of the projection optical system is large. For example, in the case where illumination of a halftone type phase shift mask with a transmittivity of 6% (pattern with a half pitch of approximately 63 nm) is performed by jointly using a polarization illumination method that linearly polarizes in the tangential direction of a circle centering on the optical axis and the zonal illumination method (zone ratio 3/4), when the illumination a is 0.95, and the numerical aperture of the projection optical system PL is NA=1.00, it is possible to increase the depth of focus (DOF) by approximately 250 nm over when random polarized light is used, and, at a numerical aperture of the projection optical system of NA=1.2 with a pattern with a half pitch of approximately 55 nm, it is possible to increase the depth of focus by approximately 100 nm.

Furthermore, in addition to the respective exposure methods discussed above, it would also be effective to apply the progressive focus exposure method disclosed in, for example, Japanese Unexamined Patent Application Publication No. H4-277612 or Japanese Unexamined Patent Application Publication No. 2001-345245 or a multi-wavelength exposure method that achieves the same effects as the progressive focus exposure method using exposure light of multiple wavelengths (for example, two wavelengths).

In the present embodiment, an optical element LS1 is attached to the front end of the projection optical system PL, and it is possible to perform adjustment of the optical characteristics of the projection optical system PL, for example, aberration (spherical aberration, coma aberration, etc.) by means of this optical element Note that the optical element attached to the front end of the projection optical system PL may be an optical plate used in the adjustment of the optical characteristics of the projection optical system PL. Or it may be a parallel flat surface plate that is able to transmit the exposure light EL.

Note that in the case where the pressure between die optical element of the front end of the projection optical system PL and the substrate P generated by the flow of the liquid LQ is large, the optical element may be firmly secured so that; it does not move by means of that pressure without making it possible to replace that optical element.

Note that, in the present embodiment, it is a configuration in which the space between the projection optical system PL and the upper surface of the substrate P is filled with the liquid, but it may also be a configuration in which the liquid LQ is filled in a status in which a cover glass consisting of parallel flat surface plates has been attached to the surface of the substrate P, for example.

In addition, the projection optical system of the embodiment discussed above fills the optical path space of the image plane side of the front end optical element with a liquid, but as disclosed in PCT International Publication No. WO 2004/019128, a projection optical system in which the optical path space of the mask side of the front end optical element is also filled with the liquid may also be employed.

Note that the liquid LQ of the present embodiment is water, but it may be a liquid other than water, for example, in the case where the light source of the exposure light EL is an $F_2$ laser, this $F_2$ laser light does not pass through water, so the liquid LQ may be a fluorine group fluid such as perfluoropolyether (PFPE) or fluorine oil that is able to transmit $F_2$ laser light. In this case, lyophilization treatment is performed by forming a thin film using a substance with the molecular structure with a small polarity that includes, for example, fluorine at the portion that comes into contact with the liquid. In addition, it is also possible to use a liquid LQ that has transmittivity with respect to the exposure light EL, has as high a refractive index as possible, and is stable with respect to the photoresist that is coated onto the projection optical system PL and the upper surface of the substrate P (for example, cedar oil). In this case as well, surface treatment is performed according to the polarity of the liquid LQ used.

Note that, applicable as the substrate P of the aforementioned respective embodiments are not only a semiconductor wafer for the manufacture of semiconductor devices but glass substrates for display devices, ceramic wafers for thin film magnetic heads, or mask or reticle base plates, etc. (synthetic quartz, silicon wafer) used in exposure apparatuses.

Applicable as the exposure apparatus EX are, in addition to step and scan system scanning exposure apparatuses (scanning steppers) that synchronously move the mask M and the substrate P to scan expose the pattern of a mask M, step and repeat system projection exposure apparatuses (steppers) that full-field expose the pattern on the mask M in a status in which the mask M and the substrate P have been made stationary and sequentially step move the substrate P.

In addition, application to an exposure apparatus of a system that full-field exposes a reduced image of a first pattern onto a substrate P using as the exposure apparatus EX a projection optical system (for example, a refracting projection optical system that does not include a reflecting element and whose redaction ratio is 1/8) in a status in which both the first pattern and the substrate P have been made nearly stationary is also possible. In this case, it is also applicable to a stitch system full-field exposure apparatus that subsequently full-field exposes a reduced image of the second pattern onto a substrate P so that it is partially superposed with the first pattern using that projection optical system in a status in which the second pattern and the substrate P have been made nearly stationary. In addition, for the stitch system exposure apparatus, application to a step and stitch system exposure apparatus that partially superposes at least two patterns on the substrate P and sequentially moves the substrate P is also possible.

In addition, the present invention is also applicable to a twin-stage type exposure apparatus disclosed in, for example, Japanese Unexamined Patent Application Publication No. 10-163099, Japanese Unexamined Patent Application Publication No. 10-214783 and Published Japanese Translation No. 2000-505958 of the PCT International Publication.

Furthermore, as disclosed in Japanese Unexamined Patent Application Publication No. 11-135400, the present invention may also be applied to an exposure apparatus comprising a measuring stage that has built in a substrate stage, which holds the substrate, a reference member, on which a reference mark is formed, and various photosensors.

In addition, in die embodiments discussed above, an exposure apparatus that locally fills the space between the projection optical system PL and the substrate P with liquid is employed, but the present invention may also be applied to a liquid immersion exposure apparatus that performs exposure in a status in which the entire surface of the substrate to be exposed is immersed in the liquid, such as those disclosed in Japanese Unexamined Patent Application Publication No. H6-124873 and Japanese Unexamined Patent Application Publication No. H10-303114.

Note that, in the embodiments discussed above, a light transmitting type mask in which a prescribed light shielding pattern (or phase pattern/light reduction pattern) has been formed on a light transmissive substrate is used, but, instead of this mask, an electronic mask that forms a transmission pattern or reflection pattern or a light emission pattern based on electronic data of the pattern to be exposed may be used as disclosed, for example, in U.S. Pat. No. 6,778,257.

In addition, it is also possible to apply the present invention to an exposure apparatus (lithography system) that exposes a line and space pattern onto a substrate P by forming interference fringes on the substrate P as disclosed in the PCT International Publication No. 2001/035168.

The types of exposure apparatuses EX are not limited to exposure apparatuses for semiconductor device fabrication that expose a semiconductor device pattern on a substrate P but are also widely applicable to exposure apparatuses for die manufacture of liquid crystal display elements and for the manufacture of displays, and exposure apparatuses for the manufacture of thin film magnetic heads, image pickup elements (CCDs), or reticles or masks.

In the case where a linear motor is used in the substrate stage PST or the mask stage MST (see U.S. Pat. No. 5,623,853 or U.S. Pat. No. 5,528,118), an air floating type that uses air bearings or a magnetic levitation type that uses Lorentz force or reactance force may be used. In addition, the respective stages PST, MST may be the types that move along a guide or may be the graceless type in which a guide is not provided.

For the drive mechanisms of the respective stages PST, MST, a planar motor that places in opposition a magnet unit that two-dimensionally arranges magnets and an armature unit that arranges coils two-dimensionally and drives the respective stages PST, MST by electromagnetic force may be used. In such a case, either the magnet unit or the armature unit is connected to the stage PST, MST, and the other from among the magnet unit and the armature unit may be provided on the moving surface side of the stage PST, MST.

The reaction force generated by the movement of the substrate stage PST may be caused to mechanically escape to the floor (ground) using a frame member so that it is not transmitted to the projection optical system PL, as described in Japanese Unexamined Patent Application Publication No. H8-166475 (U.S. Pat. No. 5,528,118).

The reaction force generated by the movement of the mask stage MST may be caused to mechanically escape to the floor (ground) using a frame member so that it is not transmitted to the projection optical system PL, as described in Japanese Unexamined Patent Application Publication No. H8-330224 (U.S. Pat. No. 5,874,820).

As discussed above, the exposure apparatus EX of the present embodiment is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Figure 17:
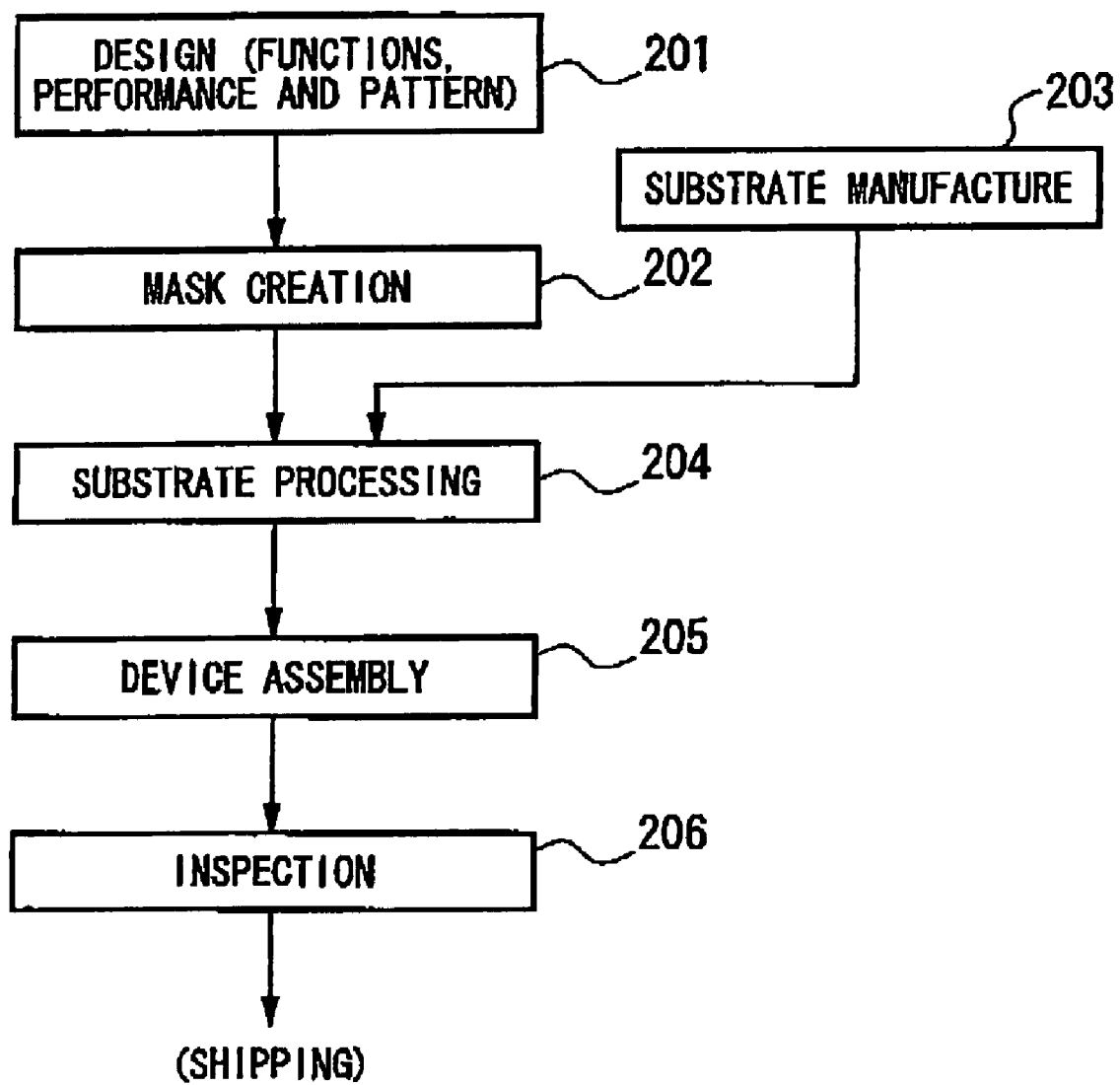
FIG. 17 is a flow chart that shows an example of a microdevice manufacturing process.

As shown in FIG. 17, microdevices such as semiconductor devices are manufactured by going through a step 201 that performs microdevice function and performance design, a step 202 that creates the mask (reticle) based on this design step, a step 203 that manufactures the substrate that is die device base material, a substrate processing step 204 that includes a process that exposes the pattern of the mask onto a substrate by means of an exposure apparatus EX of the embodiments discussed above, a device assembly step (including die dicing process, bonding process and packaging process) 205, an inspection step 206, etc.

The invention claimed is:

1. An exposure method comprising exposing a substrate with exposure light that irradiates the substrate via a liquid, wherein a concentration of an eluted substance in the liquid on the substrate satisfies the condition $$R_W - R_P \leq 1.0 \times 10^{-3}$$

where:
$R_P$ is a transmittance of the liquid containing an eluted substance eluted from the substrate per 1 mm in an optical path direction of an exposure light, and
$R_W$ is a transmittance of the liquid that does not contain the eluted substance per 1 mm in the optical path direction of the exposure light; wherein
the exposing the substrate with exposure light is performed while supplying the liquid onto the substrate and recovering the liquid from on top of the substrate, and
in order to satisfy the condition, at least one of an amount of the liquid supplied or an amount of the liquid recovered per unit time is adjusted.

2. An exposure method according to claim 1, wherein
the substrate has a base material and a photosensitive material that is coated on the base material, and
the concentration of the eluted substance is set according to information relating to the substrate.

3. An exposure method according to claim 2, wherein the information relating to the substrate includes information of the photosensitive material.

4. An exposure method according to claim 2, wherein the eluted substance includes a substance eluted from the photosensitive material.

5. An exposure method according to claim 1, wherein, in order to satisfy the condition, before the liquid is arranged on the substrate, the substrate is immersed in a second liquid.

6. An exposure method according to claim 1, wherein, in order to satisfy the condition, the substrate is covered by a thin film.

7. An exposure method according to claim 1, wherein the liquid is arranged in an optical path space of the exposure light between a projection optical system and the substrate.

8. An exposure method according to claim 1, wherein the eluted substance includes a photo acid generator.

9. A device manufacturing method that uses an exposure method according to claim 1.

10. An exposure method according to claim 1, wherein the substrate includes an amine group substance.

11. An exposure method comprising:
filling an optical path space of exposure light between a projection optical system and a substrate, and
irradiating the exposure light onto the substrate via the projection optical system and a liquid to expose the substrate, wherein the concentration of an eluted substance in the liquid when an eluted substance has been eluted from the substrate into the liquid satisfies the condition $$R_P \geq R_r$$

where:
$R_P$ is the transmittance of the liquid that has been filled in the optical path space in an optical path direction of the exposure light, and
$R_r$ is a target transmittance that has been determined in advance; wherein
the irradiating the exposure light onto the substrate is performed while supplying the liquid onto the substrate and recovering the liquid from on top of the substrate, and in order to satisfy the condition, at least one of an amount of the liquid supplied or an amount of the liquid recovered per unit time is adjusted.

12. An exposure method according to claim 11, wherein, in order to satisfy the condition, before the liquid is filled in the optical path space, the substrate is immersed in a second liquid.

13. An exposure method according to claim 11, wherein, in order to satisfy the condition, the substrate is covered by a thin film.

14. An exposure method according to claim 11, wherein
exposing a substrate with exposure light is performed while relatively moving the projection optical system and the substrate, and
in order to satisfy the condition, a velocity of the movement is adjusted.

15. An exposure method according to claim 11, wherein the eluted substance includes a photo acid generator.

16. An exposure method comprising:
forming a liquid immersion area on a substrate, and
irradiating exposure light onto the substrate via a liquid that forms the liquid immersion area to expose the substrate, wherein an allowable concentration of eluted substance eluted from the substrate in the liquid on the substrate is set that satisfies the condition $$RW - RP \leqq 1.0 \times 10-2$$

where:
RP is a transmittance of the liquid containing the eluted substance eluted from the substrate per 1 mm in the optical path direction of the exposure light after a liquid immersion area has been formed on the substrate, and
RW is a transmittance of the liquid before the eluted substance is eluted per 1 mm in the optical path direction of the exposure light.

17. An exposure method according to claim 16, wherein the allowable concentration is set while taking into account a movement velocity of the substrate.

18. An exposure method according to claim 16, wherein the liquid is pure water.

19. An exposure method comprising:
forming a liquid immersion area on a substrate, and
irradiating exposure light onto the substrate via a liquid that forms the liquid immersion area and an optical member to expose the substrate, wherein an allowable concentration of an eluted substance eluted from the substrate in the liquid on the substrate is set that satisfies the condition $$RG - RG' \leqq 1.0 \times 10-3$$

where:
RG is a transmittance of the liquid contact surface of the optical member at a first point in time, and
RG' is a transmittance of the liquid contact surface of the optical member at a second point in time after a prescribed period of time has elapsed from the first point in time after coming into contact with the liquid that includes the eluted substance.

20. An exposure method according to claim 19, wherein:
the eluted substance includes a photo acid generator included in the photosensitive material on the substrate, and
an allowable amount of the photo acid generator eluted into the liquid from the substrate is 2.2 ng/cm$^2$ or less.

21. An exposure method according to claim 19, wherein:
the eluted substance includes a photo acid generator included in the photosensitive material on the substrate, and
an allowable amount of the photo acid generator eluted into the liquid from the substrate is 2.2 ng/cm$^2$ or less.

22. An exposure method according to claim 21, wherein the optical path space of the exposure light between the optical member and the substrate is filled with a liquid by:
arranging a prescribed member that has an opening through which the exposure light passes between the optical member and the substrate, and
supplying liquid between the optical member and the prescribed member.

23. An exposure method according to claim 19, wherein:
the eluted substance includes an amine group substance included in the photosensitive material on the substrate, and
an allowable amount of the amine group substance eluted into the liquid from the substrate is 1.1 ng/cm$^2$ or less.

* * * * *